United States Patent
Pillarisetty et al.

(10) Patent No.: US 10,964,820 B2
(45) Date of Patent: Mar. 30, 2021

(54) VERTICAL TRANSISTOR DEVICES AND TECHNIQUES

(71) Applicant: Intel Corporation, Santa Clara, CA (US)

(72) Inventors: Ravi Pillarisetty, Portland, OR (US); Abhishek A. Sharma, Hillsboro, OR (US); Van H. Le, Beaverton, OR (US); Gilbert W. Dewey, Beaverton, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/461,522

(22) PCT Filed: Dec. 24, 2016

(86) PCT No.: PCT/US2016/068600
§ 371 (c)(1),
(2) Date: May 16, 2019

(87) PCT Pub. No.: WO2018/118096
PCT Pub. Date: Jun. 28, 2018

(65) Prior Publication Data
US 2019/0348540 A1     Nov. 14, 2019

(51) Int. Cl.
*H01L 29/786* (2006.01)
*H01L 27/06* (2006.01)
(Continued)

(52) U.S. Cl.
CPC .... *H01L 29/78642* (2013.01); *H01L 27/0688* (2013.01); *H01L 29/401* (2013.01);
(Continued)

(58) Field of Classification Search
CPC .......... H01L 29/78642; H01L 27/0688; H01L 29/401; H01L 29/41741; H01L 29/42392;
(Continued)

(56) References Cited

U.S. PATENT DOCUMENTS

| 8,541,819 B1* | 9/2013 | Or-Bach | H01L 21/76254 257/211 |
| 2005/0079675 A1* | 4/2005 | Ilkbahar | H01L 29/792 438/261 |

(Continued)

FOREIGN PATENT DOCUMENTS

| EP | 1804286 A1 | 7/2007 |
| WO | 2018118096 A1 | 6/2018 |

OTHER PUBLICATIONS

European Partial Supplemental Search Report in EP Application No. 16924285.6 dated Jun. 30, 2020, 11 pages.
(Continued)

*Primary Examiner* — Shahed Ahmed
(74) *Attorney, Agent, or Firm* — Patent Capital Group

(57) ABSTRACT

Disclosed herein are vertical transistor devices and techniques. In some embodiments, a device may include: a semiconductor substrate; a first transistor in a first layer on the semiconductor substrate; and a second transistor in a second layer, wherein the second transistor includes a first source/drain (S/D) contact and a second S/D contact, the first layer is between the second layer and the semiconductor substrate, and the first S/D contact is between the second S/D contact and the first layer. In some embodiments, a device may include: a semiconductor substrate; and a transistor above the semiconductor substrate, wherein the transistor includes a channel and a source/drain (S/D) contact between the channel and the semiconductor substrate.

14 Claims, 23 Drawing Sheets

(51) Int. Cl.
*H01L 29/40* (2006.01)
*H01L 29/417* (2006.01)
*H01L 29/423* (2006.01)
*H01L 29/66* (2006.01)
*H01L 29/775* (2006.01)
*H01L 27/108* (2006.01)
*H01L 27/22* (2006.01)
*H01L 27/24* (2006.01)

(52) U.S. Cl.
CPC .. *H01L 29/41741* (2013.01); *H01L 29/42392* (2013.01); *H01L 29/66439* (2013.01); *H01L 29/775* (2013.01); *H01L 27/108* (2013.01); *H01L 27/228* (2013.01); *H01L 27/2454* (2013.01)

(58) Field of Classification Search
CPC . H01L 29/6643; H01L 29/775; H01L 27/108; H01L 27/228; H01L 27/2454; H01L 29/7827; H01L 21/823487; H01L 21/823885; H01L 27/0825; H01L 27/0828
See application file for complete search history.

(56) References Cited

U.S. PATENT DOCUMENTS

| | | |
|---|---|---|
| 2005/0282356 A1 | 12/2005 | Lee |
| 2006/0169972 A1 | 8/2006 | Furukawa et al. |
| 2009/0127608 A1 | 5/2009 | Weis |
| 2010/0044784 A1 | 2/2010 | Oh et al. |
| 2010/0112753 A1 | 5/2010 | Lee |
| 2015/0263033 A1* | 9/2015 | Aoyama ........... H01L 21/02667 257/65 |
| 2016/0163856 A1* | 6/2016 | Doyle .................... B82Y 10/00 257/191 |
| 2016/0268382 A1 | 9/2016 | Colinge et al. |
| 2016/0284712 A1 | 9/2016 | Liaw |
| 2018/0350785 A1* | 12/2018 | Fong ................. H01L 21/76254 |

OTHER PUBLICATIONS

International Search Report and Written Opinion issued in PCT Application No. PCT/US2016/068600 dated Aug. 25, 2017; 11 pages.
Extended European Search Report in EP Application No. 16924285.6 dated Oct. 2, 2020, 10 pages.

* cited by examiner

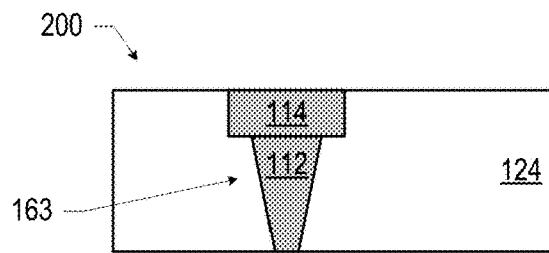
FIG. 2A
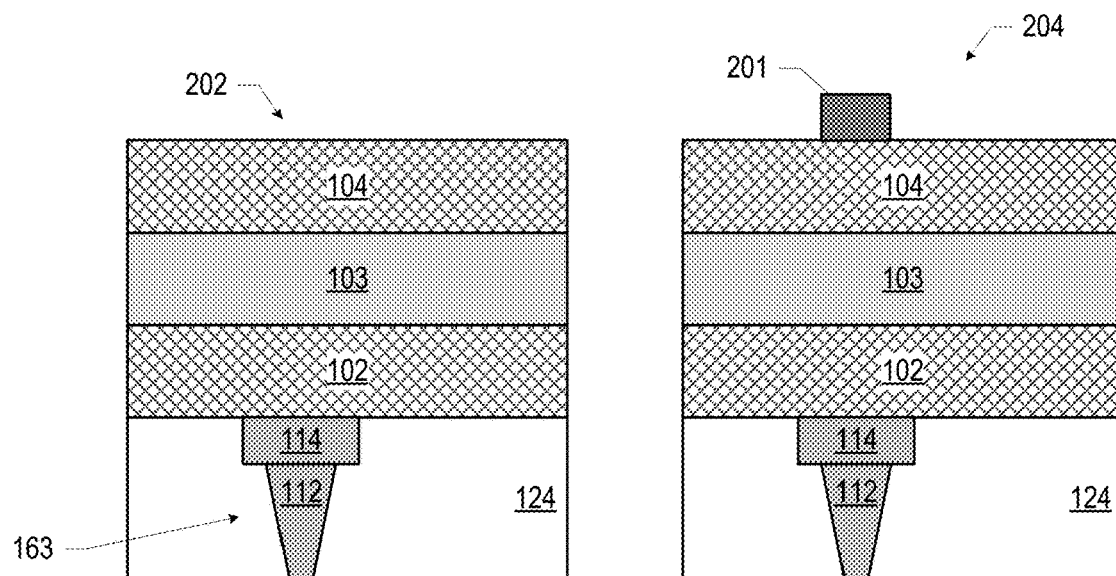
FIG. 2B
FIG. 2C
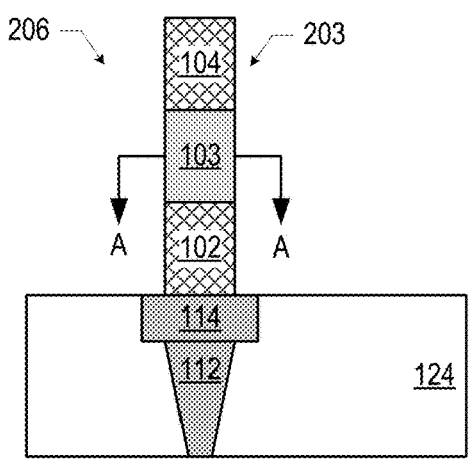
FIG. 2D
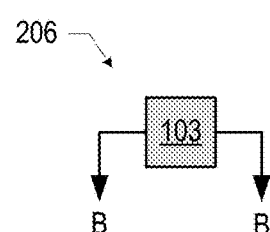
FIG. 2E

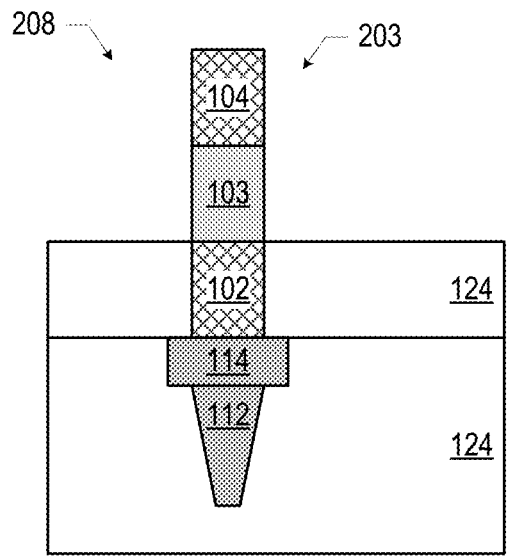
FIG. 2F
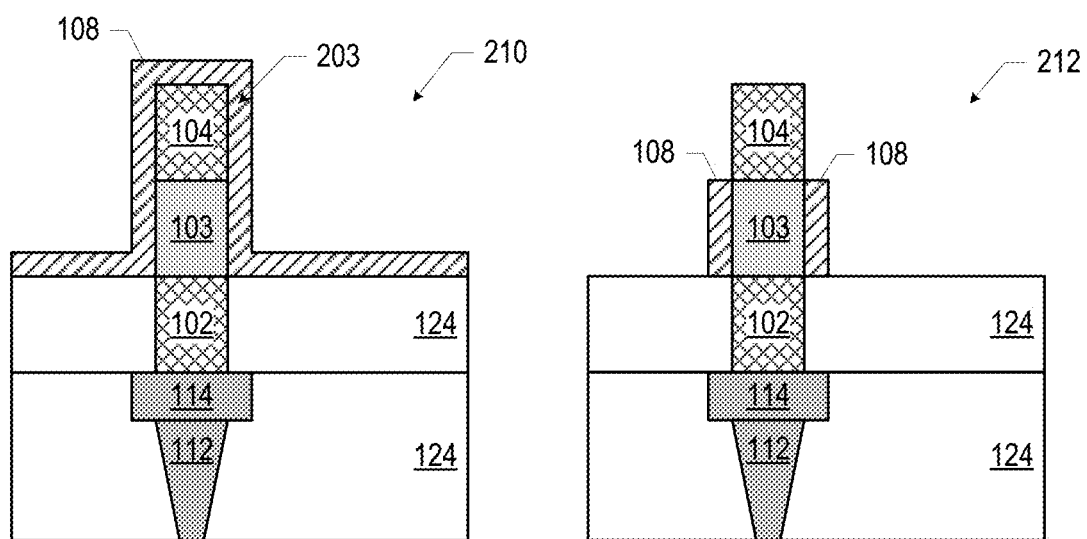
FIG. 2G
FIG. 2H

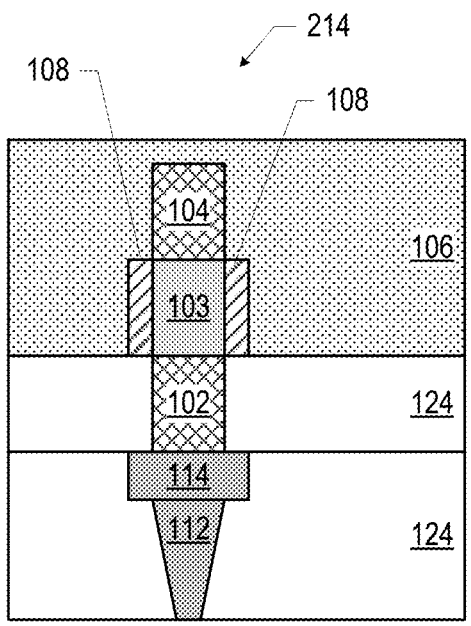
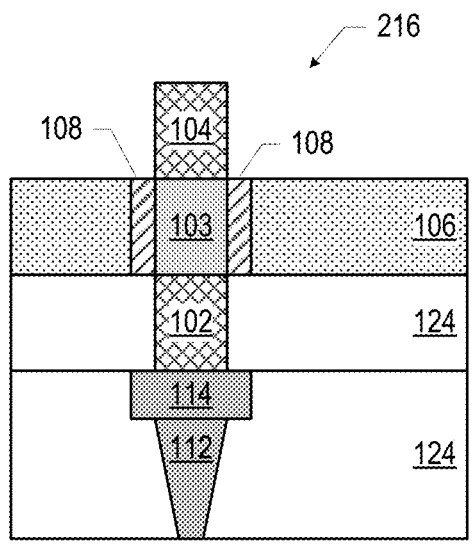
FIG. 2I
FIG. 2J
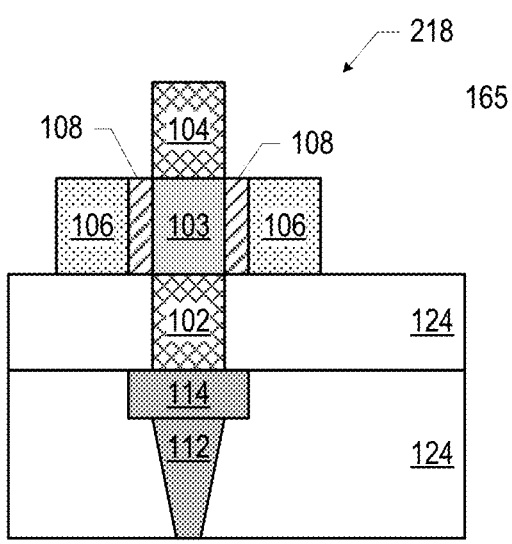
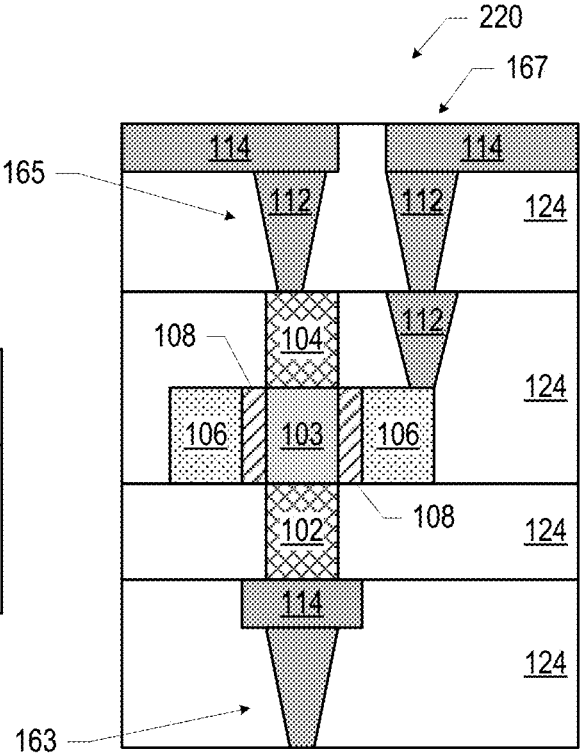
FIG. 2K
FIG. 2L

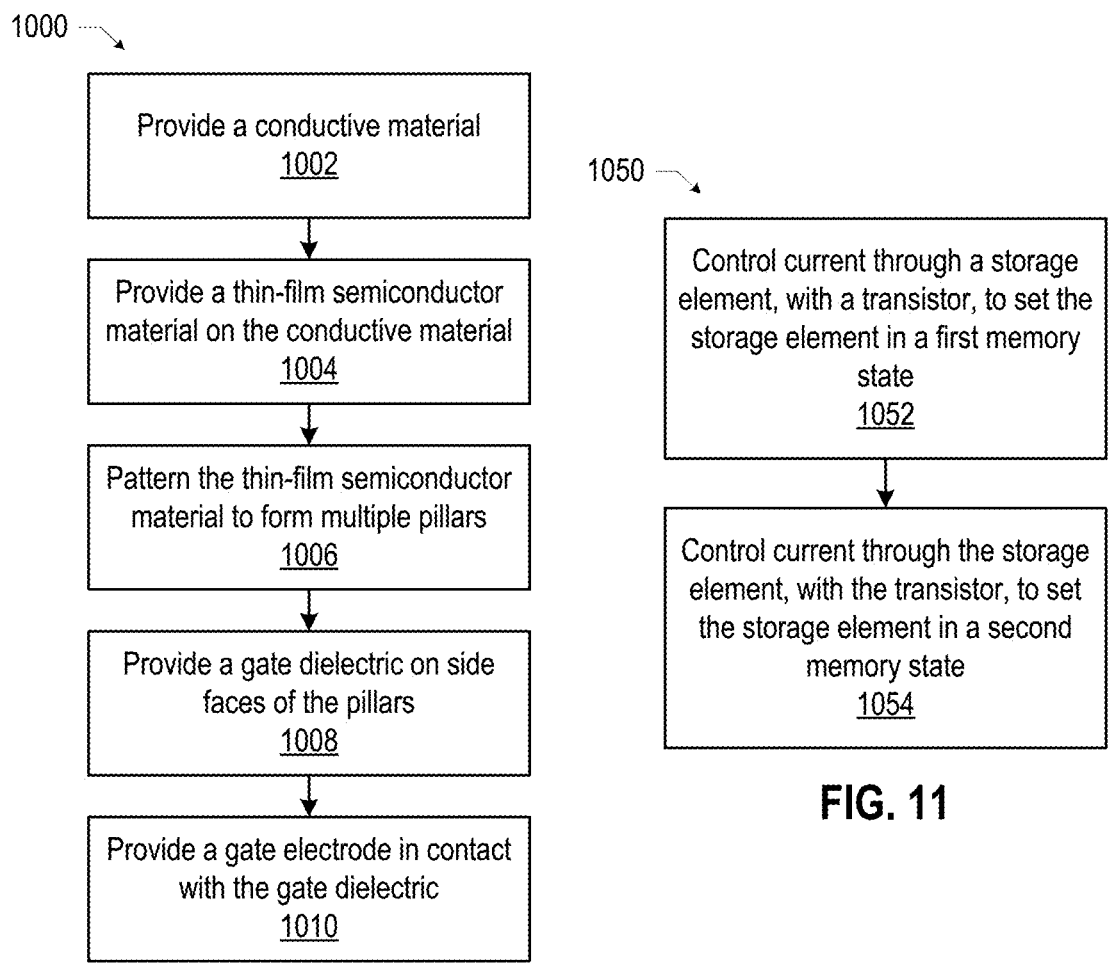
FIG. 10
FIG. 11
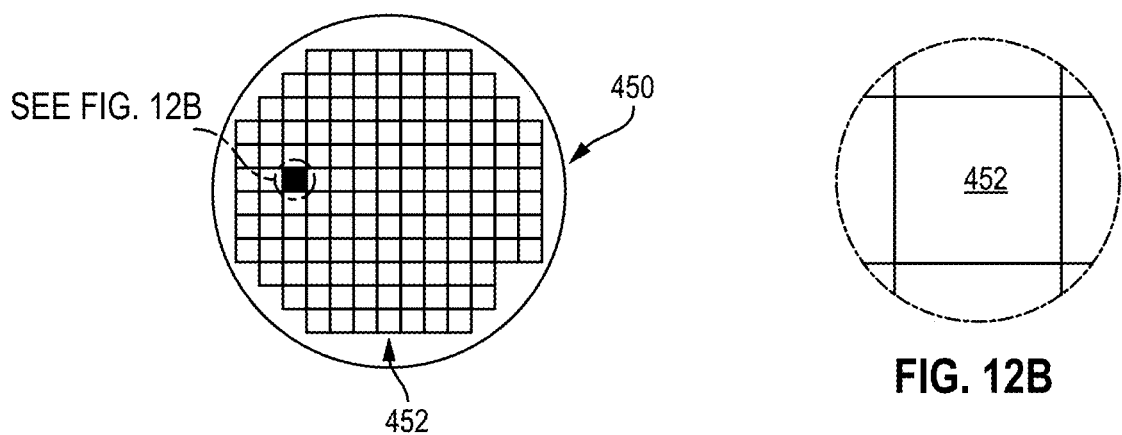
FIG. 12A
FIG. 12B

(12)  US 10,964,820 B2

VERTICAL TRANSISTOR DEVICES AND TECHNIQUES

CROSS-REFERENCE TO RELATED APPLICATION

This application is a national stage application under 35 U.S.C. § 371 of PCT International Application Serial No. PCT/US2016/068600 filed on Dec. 24, 2016 and entitled "VERTICAL TRANSISTOR DEVICES AND TECHNIQUES," which is hereby incorporated herein by reference in its entirety.

BACKGROUND

Conventional transistors are formed in a device layer on a semiconductor substrate, at the "front end" of a manufacturing process. Such conventional transistors have been limited in their scalability in some application (e.g., memory applications).

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A-2L illustrate various example stages in the manufacture of the electronic device of FIGS. 1A-1B, in accordance with various embodiments.

FIG. 10 is a flow diagram of an illustrative method of manufacturing a vertical transistor, in accordance with various embodiments.

FIG. 11 is a flow diagram of an illustrative method of operating a memory cell in an electronic device, in accordance with various embodiments.

FIGS. 12A and 12B are top views of a wafer and dies that may include any of the vertical transistors disclosed herein.

DETAILED DESCRIPTION

Figure 1A:
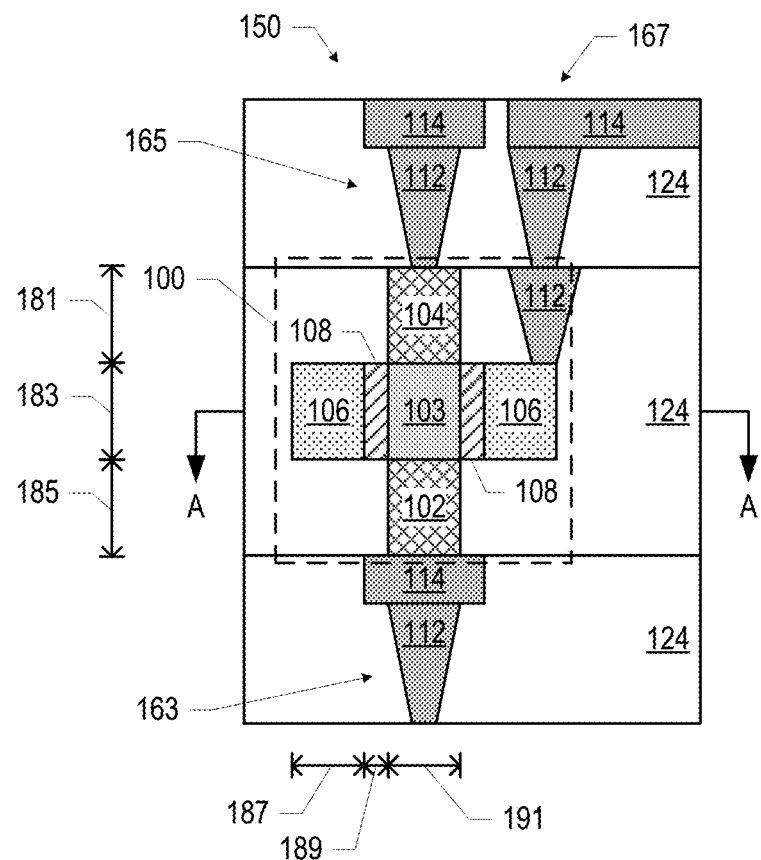
FIGS. 1A-1B are cross-sectional views of an example electronic device including a vertical transistor, in accordance with various embodiments.

Disclosed herein are vertical transistor devices and techniques. In some embodiments, a device may include: a semiconductor substrate; a first transistor in a first layer on the semiconductor substrate; and a second transistor in a second layer, wherein the second transistor includes a first source/drain (S/D) contact and a second S/D contact, the first layer is between the second layer and the semiconductor substrate, and the first S/D contact is between the second S/D contact and the first layer. In some embodiments, a device may include: a semiconductor substrate; and a transistor above the semiconductor substrate, wherein the transistor includes a channel and a source/drain (S/D) contact between the channel and the semiconductor substrate.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C). For ease of discussion, all of the lettered sub-figures associated with a particular numbered figure may be referred to by the number of that figure; for example, FIGS. 1A-1B may be referred to as "FIG. 1," FIGS. 2A-2L may be referred to as "FIG. 2," etc.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The disclosure may use the singular term "layer," but the term "layer" should be understood to refer to assemblies that may include multiple different material layers. The accompanying drawings are not necessarily drawn to scale.

Figure 1B:
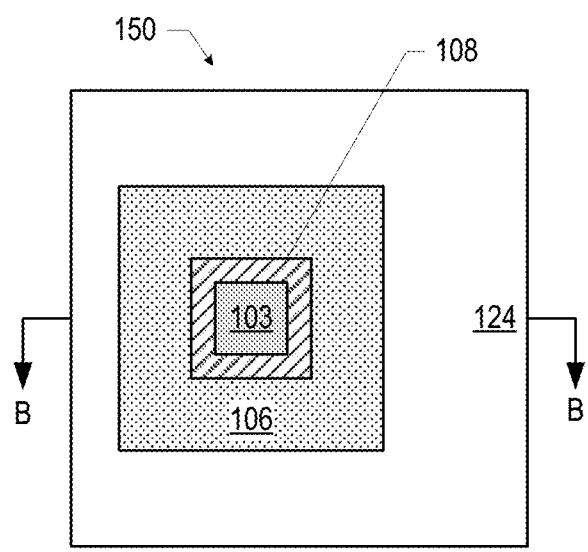

FIGS. 1A-1B are cross-sectional views of an example electronic device 150 including a vertical transistor 100, in accordance with various embodiments. In particular, FIG. 1A is a "side" cross-sectional view (through the section B-B of FIG. 1B), and FIG. 1B is a "top" cross-sectional view (through the section A-A of FIG. 1A). The vertical transistor 100 may include a bottom S/D contact 102, a top S/D contact 104, and a channel 103 disposed between the S/D contacts 102 and 104. A gate dielectric 108 may laterally surround the channel 103, and a gate electrode 106 may laterally surround the gate dielectric 108 such that the gate dielectric 108 is disposed between the gate electrode 106 and the channel 103. The materials of the gate dielectric 108 and the gate electrode 106 may take the form of any of the gate dielectrics and gate electrodes, respectively, discussed below with reference to FIG. 8.

In some embodiments, the channel 103 may be formed of a thin film material. Some such materials may be deposited at relatively low temperatures, which makes them depositable within the thermal budgets imposed on back-end fabrication to avoid damaging the front-end components. In some embodiments, the channel 103 may be formed of an amorphous, polycrystalline, or crystalline semiconductor, or an amorphous, polycrystalline, or crystalline semiconducting oxide. In some embodiments, the channel 103 may be formed of an amorphous, polycrystalline, or crystalline III-V material; amorphous, polycrystalline, or crystalline silicon; amorphous, polycrystalline, or crystalline germanium; amorphous, polycrystalline, or crystalline silicon germanium; amorphous, polycrystalline, or crystalline gallium arsenide; amorphous, polycrystalline, or crystalline indium antimonide; amorphous, polycrystalline, or crystalline indium gallium arsenide; amorphous, polycrystalline, or crystalline gallium antimonide; amorphous, polycrystalline, or crystalline tin oxide; amorphous, polycrystalline, or crystalline indium gallium oxide (IGO); or amorphous, polycrystalline, or crystalline indium gallium zinc oxide (IGZO).

In FIG. 1, the S/D contact 102 is in contact with a conductive pathway 163 that may route electrical signals to and/or from the S/D contact 104. In FIG. 1, the conductive pathway 163 is illustrated as including a conductive via 112 and a conductive line 114. In some embodiments, the conductive line 114 of the conductive pathway 163 may be a bit line for a memory cell including the vertical transistor 100, as discussed below. The arrangement of conductive lines and vias in the conductive pathway 163 to the S/D contact 102 in FIG. 1 is simply illustrative, and any suitable interconnect arrangement may be used.

The S/D contact 104 of FIG. 1 is in contact with a conductive pathway 165 that may route electrical signals to and/or from the S/D contact 104. In FIG. 1, the conductive pathway 165 is illustrated as including a conductive via 112 and a conductive line 114, but this is simply illustrative, and any suitable interconnect arrangement may be used. For example, in some embodiments, the conductive line 114 of the conductive pathway 165 may be a bit line for a memory cell including the vertical transistor 100, as discussed below. In some embodiments, the conductive line 114 of the conductive pathway 165 may directly contact the S/D contact 104, without an intervening conductive via 112.

A number of different conductive materials may be used for the S/D contacts 102 and 104. In some embodiments, the S/D contacts 102 and/or 104 may include a metal, such as copper. In some embodiments, the S/D contacts 102 and/or 104 may include a doped semiconductor, such as silicon or another semiconductor doped with an n-type dopant or a p-type dopant. When the S/D contacts 102 and/or 104 include a doped material, the materials used for the S/D contacts 102 and/or 104 may take the form of any of the S/D regions 118 discussed below with reference to FIG. 8. Metals may provide higher conductivity, while doped semiconductors may be easier to pattern during fabrication.

The gate electrode 106 of FIG. 1 is in contact with a conductive pathway 167 that may route electrical signals to and/or from the gate electrode 106. In FIG. 1, the conductive pathway 107 is illustrated as including a conductive via 112 and a conductive line 114, but this is simply illustrative, and any suitable interconnect arrangement may be used. For example, in some embodiments, the gate electrode 106 itself may be part of a word line for a memory cell including the vertical transistor 100, as discussed below, and the conductive via 112 may serve as a conductive contact to this word line for multiple vertical transistors 100. The conductive vias 112 and the conductive lines 114 illustrated in FIG. 1 (and FIGS. 3, 5, and 7) may take the form of any of the embodiments of conductive vias and lines, respectively, discussed below with reference to FIG. 8.

An insulating material 124 may be disposed around the vertical transistor 100 and the electrical interconnects of FIG. 1, as shown. The insulating material 124 of FIG. 1 (and FIGS. 3, 5, and 7) may take the form of any of the embodiments of the insulating material 124 discussed below with reference to FIG. 8.

The components of the vertical transistors 100 disclosed herein may have dimensions of any suitable values. For example, in some embodiments, the S/D contact 102 may have a thickness 185 between 100 and 300 nanometers (e.g., 200 nanometers). In some embodiments, a thickness 183 of the channel 103, the gate dielectric 108, and the gate electrode 106 may be approximately the same, and/or each may be between 10 and 100 nanometers (e.g., between 40 and 50 nanometers). In some embodiments, the S/D contact 104 may have a thickness 181 between 10 and 300 nanometers (e.g., 200 nanometers). In some embodiments, the width 191 of the S/D contact 102, the channel 103, and the S/D contact 104 may be approximately the same, and/or each may be between 10 and 15 nanometers. In some embodiments, the width 189 of the gate dielectric 108 may be between 2 and 3 nanometers. In some embodiments, the width 187 of the gate electrode 106 may be between 10 and 20 nanometers.

The vertical transistors 100 disclosed herein may be formed using any suitable technique. For example, FIGS. 2A-2L illustrate various example stages in the manufacture of the vertical transistor 100 of FIG. 1, in accordance with various embodiments.

FIG. 2A is a side cross-sectional view of an assembly 200 subsequent to forming an interconnect structure including the conductive pathway 163. Insulating material 124 may be disposed around the conductive pathway 163 in the assembly 200. Any suitable fabrication techniques may be used to form the assembly 200 (e.g., subtractive, additive, Damascene, dual Damascene, etc.), and the assembly 200 may represent a portion of a larger device. Additionally, as noted above, the interconnect structure shown in FIG. 2A is simply illustrative, and subsequent operations may be performed on any suitable "starting" assembly. For example, in some embodiments, a storage element may be included in the assembly 200, and may be electrically coupled to the S/D contact 102 during fabrication of the vertical transistor 100, as discussed below.

FIG. 2B is a side cross-sectional view of an assembly 202 subsequent to providing material for the S/D contact 102, material for the channel 103, and material for the S/D contact 104 on the assembly 200 (FIG. 2A). The techniques used to provide the material for the S/D contact 102 and the S/D contact 104 may depend on the particular materials, and may include atomic layer deposition (ALD), physical vapor deposition (PVD), or chemical vapor deposition (CVD). In embodiments in which the S/D contacts 102 and 104 include a dopant, a material may be initially deposited and then doped with the dopant using any suitable technique. As noted above, in some embodiments, the material for the channel 103 may be deposited using a thin film deposition technique (e.g., sputtering, evaporation, molecular beam epitaxy (MBE), CVD, or ALD).

FIG. 2C is a side cross-sectional view of an assembly 204 subsequent to providing a layer of mask material 201 on the assembly 202 (FIG. 2B) and patterning the mask material 201. A portion of the material for the S/D contact 104 may be exposed by the patterning of the mask material 201, and the pattern in the resist material 201 may correspond to a desired pattern for the S/D contact 102, channel 103, and S/D contact 104, as known in the art and as discussed below. In some embodiments, the mask material 201 may be a photoresist that may be removed in subsequent operations. In some embodiments, the mask material 201 may be a hardmask that may be removed or may remain as part of the electronic device 150 (not shown in the drawings for clarity of illustration).

FIG. 2D is a side cross-sectional view of an assembly 206 subsequent to patterning the material for the S/D contact 104, the material for the channel 103, and the material for the S/D contact 102 of the assembly 204 (FIG. 2C) to form the S/D contact 104, the channel 103, and the S/D contact 102. FIG. 2E is a top cross-sectional view of the assembly 206 (through the section A-A of FIG. 2D) such that the view of FIG. 2D is taken through the section B-B of FIG. 2E. The assembly 206 may thus include a pillar 203 extending from the conductive line 114 of the conductive pathway 163, wherein the pillar 203 includes the S/D contact 102, the channel 103, and the S/D contact 104. As used herein, "patterning" may refer to forming a pattern in one or more materials using any suitable techniques (e.g., applying a resist, patterning the resist using lithography, and then etching the one or more material using dry etching, wet etching, or any appropriate technique). In some embodiments, the formation of the pillar 203 may be performed in a single set of etch operations, while in other embodiments, the pillar 203 may be formed by etching a ridge into the assembly 204 (e.g., ridges that extend in and out of the plane of the drawing), then performing another set of etch operations to form the ridge into a pillar 203 (e.g., by etching trenches in planes parallel to the plane of the drawing). As discussed below, multiple pillars 203 may be formed using such techniques, although only a single pillar 203 is shown in FIGS. 2D and 2E for clarity of illustration.

FIG. 2F is a side cross-sectional view of an assembly 208 subsequent to providing insulating material 124 around the pillar 203 of the assembly 206 (FIGS. 2D and 2E). In some embodiments, the insulating material 124 may initially be deposited so as to extend over the pillar 203, then the insulating material 124 may be recessed back so that the insulating material 124 extends up the pillar 203 to the height of the S/D contact 102. Any suitable technique may be used to provide the insulating material 124, such as spin coating, chemical vapor deposition (CVD), or plasma-enhanced CVD (PECVD).

FIG. 2G is a side cross-sectional view of an assembly 210 subsequent to conformally depositing material for the gate dielectric 108 on the assembly 208 (FIG. 2F). The material for the gate dielectric 108 may be deposited on the exposed portions of the pillar 203 (including the side faces of the channel 103) and on the exposed surface of the insulating material 124. As noted elsewhere herein, the material for the gate dielectric 108 may take the form of any of the gate dielectric materials discussed herein. For example, the gate dielectric 108 may be a multi-layer gate dielectric including multiple different materials. In some embodiments, the gate dielectric 108 may be deposited using atomic layer deposition (ALD).

FIG. 2H is a side cross-sectional view of an assembly 212 subsequent to performing a directional (or "anisotropic") etch on the material for the gate dielectric 108 in the assembly 210 (FIG. 2G) to remove some of the material for the gate dielectric 108 while leaving the gate dielectric 108 on the exposed side faces of the channel 103. In this manner, the gate dielectric 108 may surround the channel 103 in the assembly 212. In some embodiments, the directional etch may be a dry etch.

FIG. 2I is a side cross-sectional view of an assembly 214 subsequent to depositing material for the gate electrode 106 of the assembly 212 (FIG. 2H). Any suitable technique may be used to deposit the material for the gate electrode 106, such as sputtering, evaporation, ALD, or CVD techniques. As noted elsewhere herein, the material for the gate electrode 106 may take the form of any of the gate electrode materials discussed herein. In some embodiments, the material for the gate electrode 106 may initially be deposited so as to extend over the pillar 203, then the insulating material 124 may be polished back (e.g., using a chemical mechanical polishing (CMP) technique).

FIG. 2J is a side cross-sectional view of an assembly 216 subsequent to recessing the material for the gate electrode 106 of the assembly 214 (FIG. 2I). The material for the gate electrode 106 may be recessed back so that the material for the gate electrode 106 does not contact the S/D contact 104, and so that the gate dielectric 108 may be disposed between the channel 103 and the material for the gate electrode 106. Any suitable technique may be used to recess the material for the gate electrode 106 (e.g., a wet or dry recess).

FIG. 2K is a side cross-sectional view of an assembly 218 subsequent to patterning the material for the gate electrode 106 of the assembly 216 (FIG. 2J) to form the gate electrode 106. As illustrated in FIG. 2K (and FIG. 1B), the gate electrode 106 may laterally surround the gate dielectric 108. The patterning of the material for the gate electrode 106 may be performed using any suitable technique (e.g., using a photosensitive resist, exposing and developing the photosensitive resist, then etching away the unwanted material in accordance with the pattern in the resist). As discussed above with reference to the formation of the pillar 203, and as discussed below, the formation of the gate electrode 106 may involve one or multiple sets of etch operations. In some embodiments, the gate electrode 106 may be materially continuous between multiple vertical transistors 100, as discussed below.

FIG. 2L is a side cross-sectional view of an assembly 220 subsequent to forming additional interconnect structures (e.g., conductive vias 112 and conductive lines 114 for the conductive pathways 165 and 167) on the assembly 218 (FIG. 2K). Insulating material 124 may be disposed around the additional interconnect structures in the assembly 220. Any suitable fabrication techniques may be used to form the additional interconnect structures in the assembly 220 (e.g., subtractive, additive, Damascene, dual Damascene, etc.). Additionally, as noted above, the interconnect structure shown in FIG. 2L is simply illustrative, and any desired further fabrication operations may be performed on the assembly 218. For example, in some embodiments, a storage element may be formed after formation of the vertical transistor 100, and the storage element may be electrically coupled to the S/D contact 104.

Figure 3A:
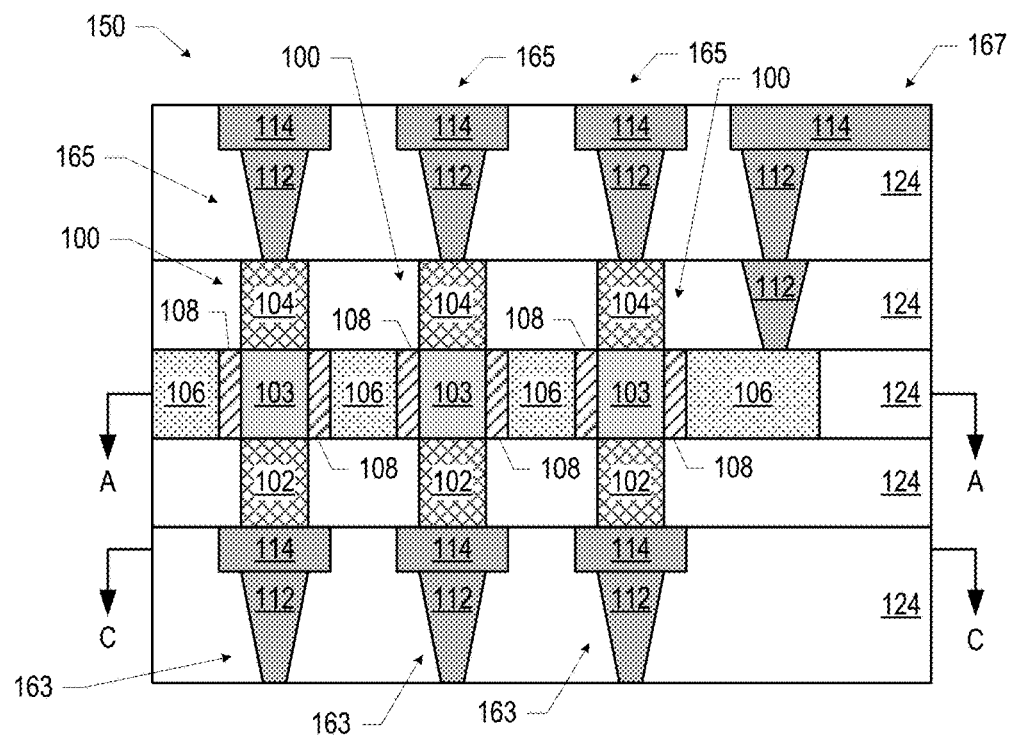
FIGS. 3A-3C are cross-sectional views of an example electronic device including an array of vertical transistors, in accordance with various embodiments.
Figure 3B:
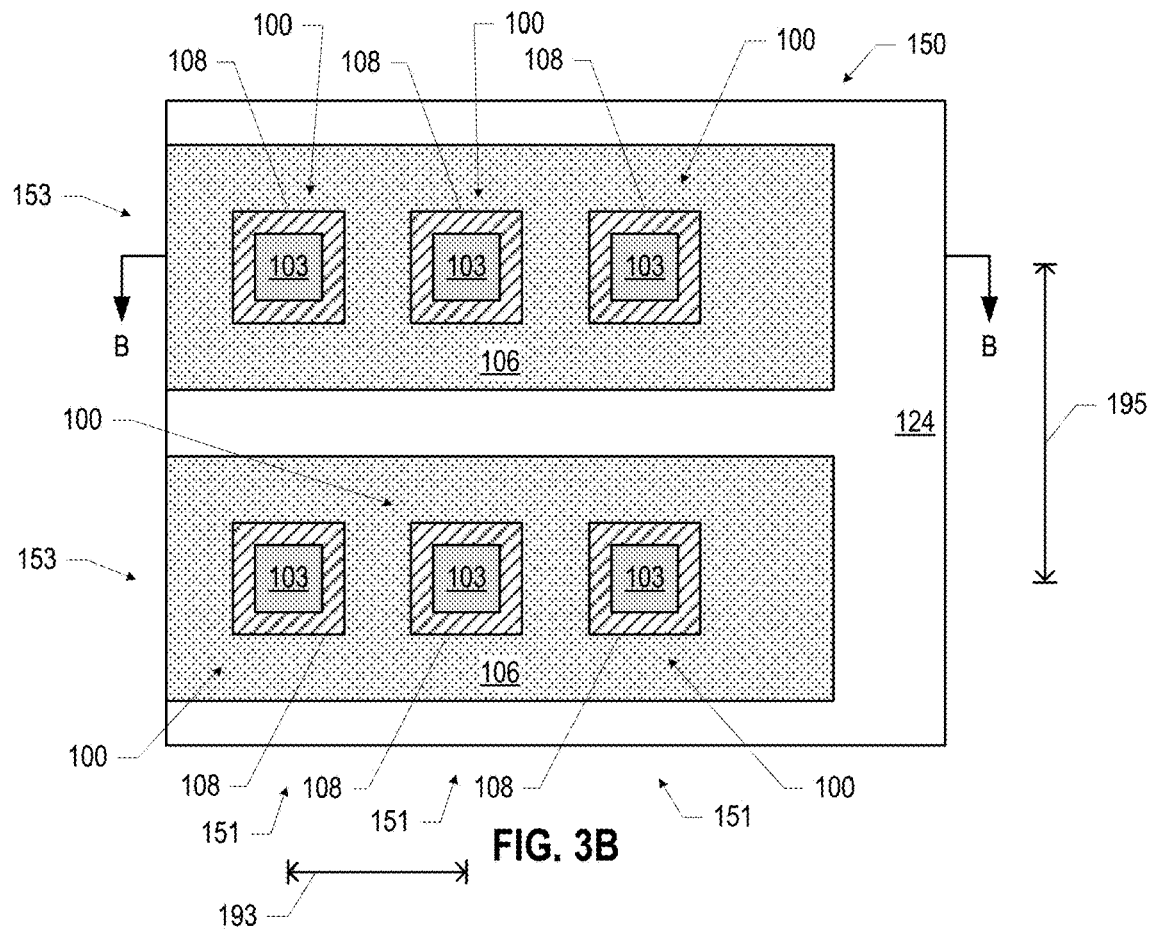
Figure 3C:
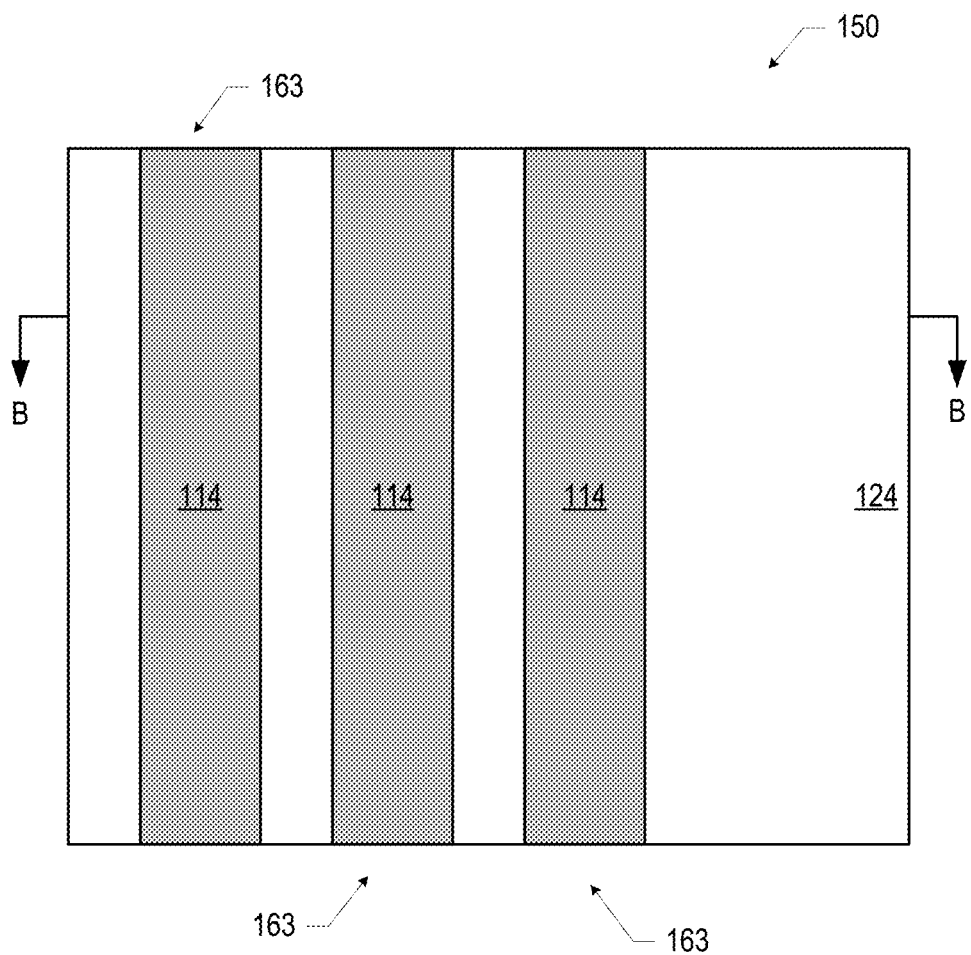

As noted above, in some embodiments, an electronic device 150 may include multiple vertical transistors 100. Some of these vertical transistors 100 may be fabricated simultaneously, and may be electrically coupled in any of a number of ways. For example, FIGS. 3A-3C are cross-sectional views of an example electronic device 150 including an array of vertical transistors 100, in accordance with various embodiments. In particular, FIG. 3A is a "side" cross-sectional view (through the section B-B of FIGS. 3B-3C), FIG. 3B is a "top" cross-sectional view (through the section A-A of FIG. 3A), and FIG. 3C is a "top" cross-sectional view (through the section C-C of FIG. 3A). A number of the components of the electronic device 150 of FIG. 3 may take the form of any of the embodiments of those components discussed elsewhere herein, and thus these components are not discussed again with reference to FIG. 3 for clarity of illustration.

In the electronic device 150 of FIG. 3, multiple vertical transistors 100 may be arranged in an array. The array of the electronic device 150 of FIG. 3 may be a regular rectangular array (e.g., a grid), but other arrays of multiple vertical transistors 100 may be used. For discussion purposes, the vertical transistors 100 of the electronic device 150 of FIG. 3 may be referred to as being arranged in columns 151 and rows 153; these labels are intended to enable a discussion of the relative placement and connections between different ones of the vertical transistors 100. Although particular devices including an array of vertical transistors 100 are discussed herein, an array of vertical transistors 100 may be included in any suitable device, such as a 1 transistor-1 capacitor (1T1C) device, a 1 transistor-1 resistor (1T1R) device, a dynamic random access memory (DRAM) cell array, a resistive random access memory (RRAM) cell array, a magnetic random access memory (MRAM) cell array, a capacitive DRAM cell array, or any other suitable device.

As illustrated in FIG. 3, the vertical transistors 100 in a particular row 153 may share a gate electrode 106. In some embodiments, sharing a gate electrode 106 between multiple vertical transistors 100 may mean that the gate electrodes 106 of the multiple vertical transistors 100 are materially continuous. In some embodiments, the gate electrodes 106 of different ones of the vertical transistors 100 in a particular row 153 may have gate electrodes 106 that are not materially continuous, but that are electrically coupled so that all of the gate electrodes 106 in the row 153 have the same voltage at any given time. The gate electrodes 106 in different rows 153 may not be materially continuous, as shown, and the voltages on the gate electrodes 106 in different rows 153 may be independently controllable.

As illustrated in FIG. 3, the vertical transistors 100 in a particular column 151 may share a conductive line 114 of the conductive pathway 163 in that the S/D contacts 102 of each of the vertical transistors 100 in a particular column 151 are electrically coupled to the same conductive line 114 (and thus have the same voltage at any given time). In some embodiments, as discussed below, the conductive line 114 of the conductive pathway 163 may itself provide the S/D contacts 102 of multiple vertical transistors 100 in a particular column 151. The vertical transistors 100 in different columns 151 may not share a conductive line 114 of the conductive pathway 163, as shown, and the voltages on these conductive lines 114 (and thus on the S/D contacts 102) in different columns 151 may be independently controllable.

The spacing between different ones of the vertical transistors 100 in an array may take any suitable values. For example, in some embodiments, the center-to-center spacing 193 between adjacent vertical transistors in a row 153 may be between 30 and 300 nanometers (e.g., 50 nanometers). In some embodiments, the center-to-center spacing 195 between adjacent vertical transistors in a column 151 may be between 30 and 300 nanometers (e.g., 50 nanometers). In some embodiments, the center-to-center spacing 193 and the center-to-center spacing 195 may be equal.

FIGS. 4A-4I illustrate various example stages in the manufacture of the electronic device 150 of FIGS. 3A-3C, in accordance with various embodiments. However, as noted above, the vertical transistors 100 and electronic devices 150 disclosed herein may be formed using any suitable techniques.

Figure 4A:
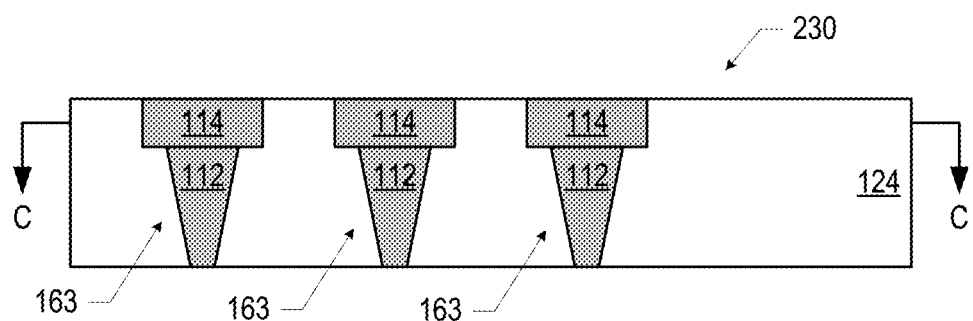
FIGS. 4A-4I illustrate various example stages in the manufacture of the electronic device of FIGS. 3A-3C, in accordance with various embodiments.
Figure 4B:
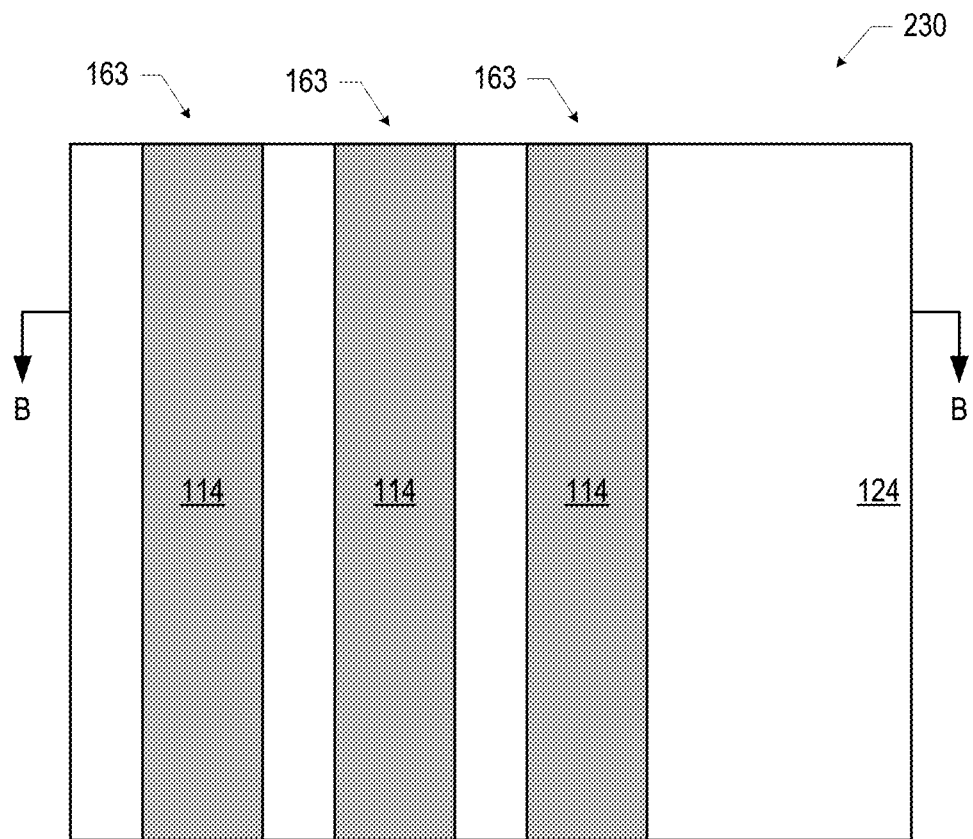

FIG. 4A is a side cross-sectional view of an assembly 230 subsequent to forming an interconnect structure including multiple conductive pathways 163. Insulating material 124 may be disposed around the conductive pathways 163 in the assembly 230, and the assembly 230 may be formed using any of the techniques discussed above with reference to the assembly 200 of FIG. 2A. FIG. 4B is a top cross-sectional view of the assembly 230 through the section C-C of FIG. 4A (such that the view of FIG. 4A is taken through the section B-B of FIG. 4B). As shown in FIG. 4B, the conductive lines 114 of the conductive pathways 163 may take the form of multiple parallel ridges. The interconnect structure shown in FIG. 4A is simply illustrative, and subsequent operations may be performed on any suitable "starting" assembly. For example, in some embodiments, a storage element may be included in the assembly 230, and may be electrically coupled to the S/D contact 102 during fabrication of the vertical transistor 100, as discussed below.

Figure 4C:
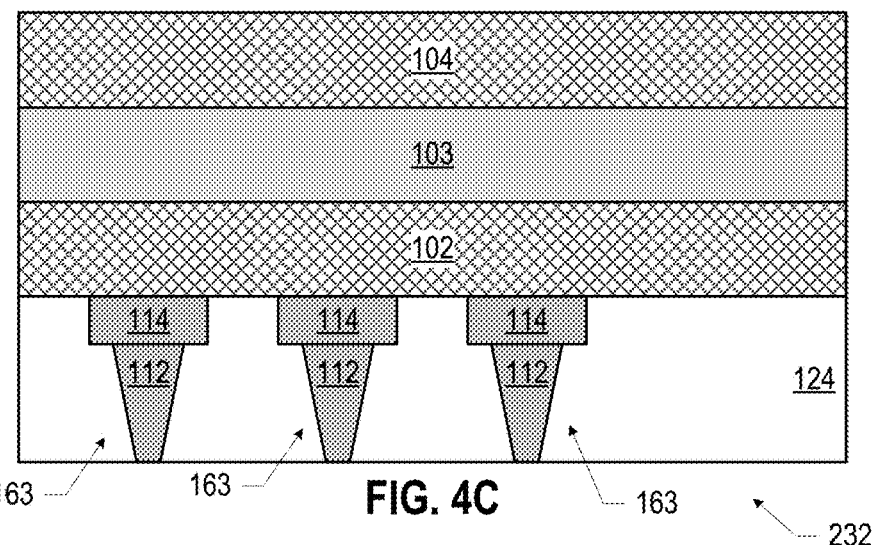

FIG. 4C is a side cross-sectional view (from the same perspective as FIG. 4A) of an assembly 232 subsequent to providing material for the S/D contact 102, material for the channel 103, and material for the S/D contact 104 on the assembly 230 (FIGS. 4A and 4B). The provision of these materials may take any of the forms discussed above with reference to the assembly 202 of FIG. 2B.

Figure 4D:
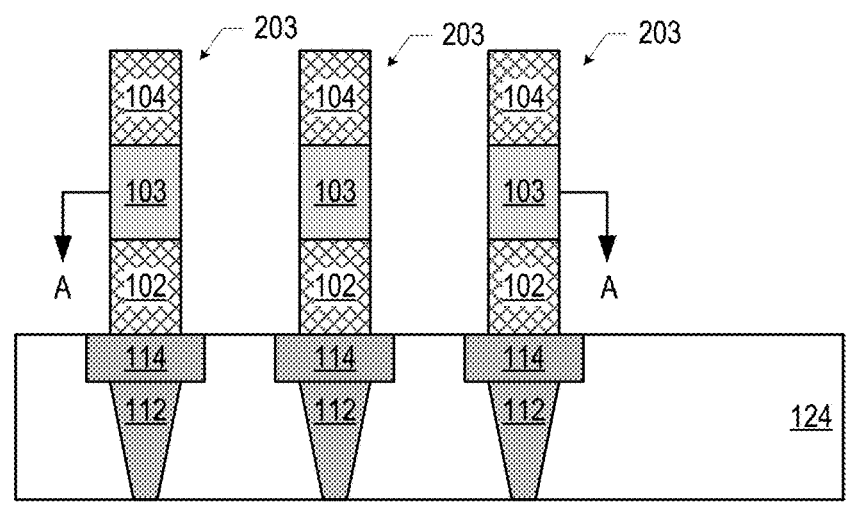
Figure 4E:
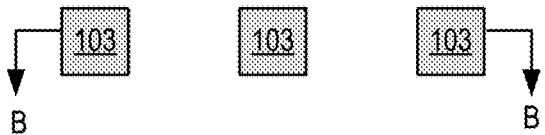
Figure 4E:

FIG. 4D is a side cross-sectional view of an assembly 234 subsequent to patterning the material for the S/D contact 104, the material for the channel 103, and the material for the S/D contact 102 of the assembly 232 (FIG. 4C) to form multiple pillars 203, each including an S/D contact 104, a channel 103, and an S/D contact 102. FIG. 4E is a top cross-sectional view of the assembly 234 (through the section A-A of FIG. 4D) such that the view of FIG. 4D is taken through the section B-B of FIG. 4E. In some embodiments, the pillars 203 may be arranged in an array including rows 153 and columns 151. Pillars 203 in a same column 151 may extend from a same conductive line 114 of the conductive pathways 163, while pillars 203 in different columns 151 may extend from different conductive lines 114. The formation of the pillars 203 may take any of the forms discussed above with reference to FIGS. 2C and 2D. For example, in some embodiments, the formation of the pillars 203 may be performed in a single set of etch operations, while in other embodiments, the material for the S/D contacts 102, the material for the channels 103, and the material for the S/D contacts 104 may first be etched into rows or columns, then etched in the other direction to form the array of pillars 203.

Figure 4F:
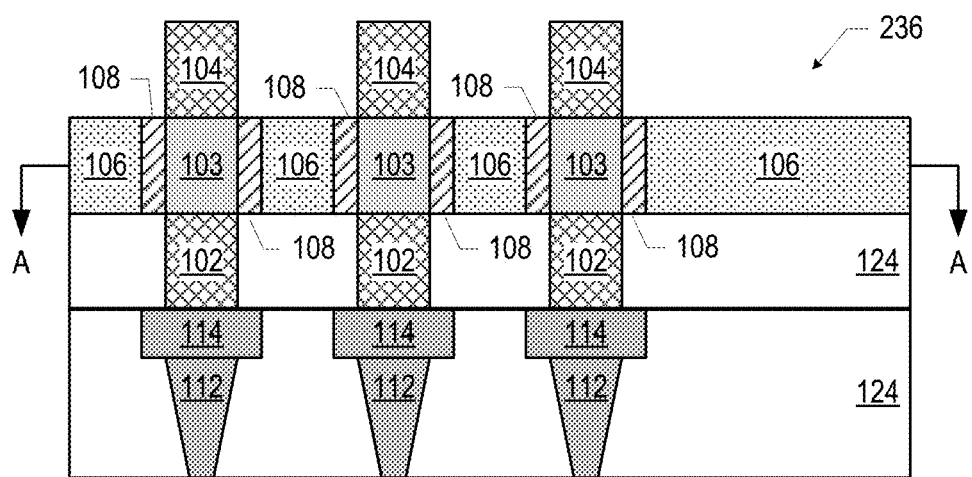
Figure 4G:
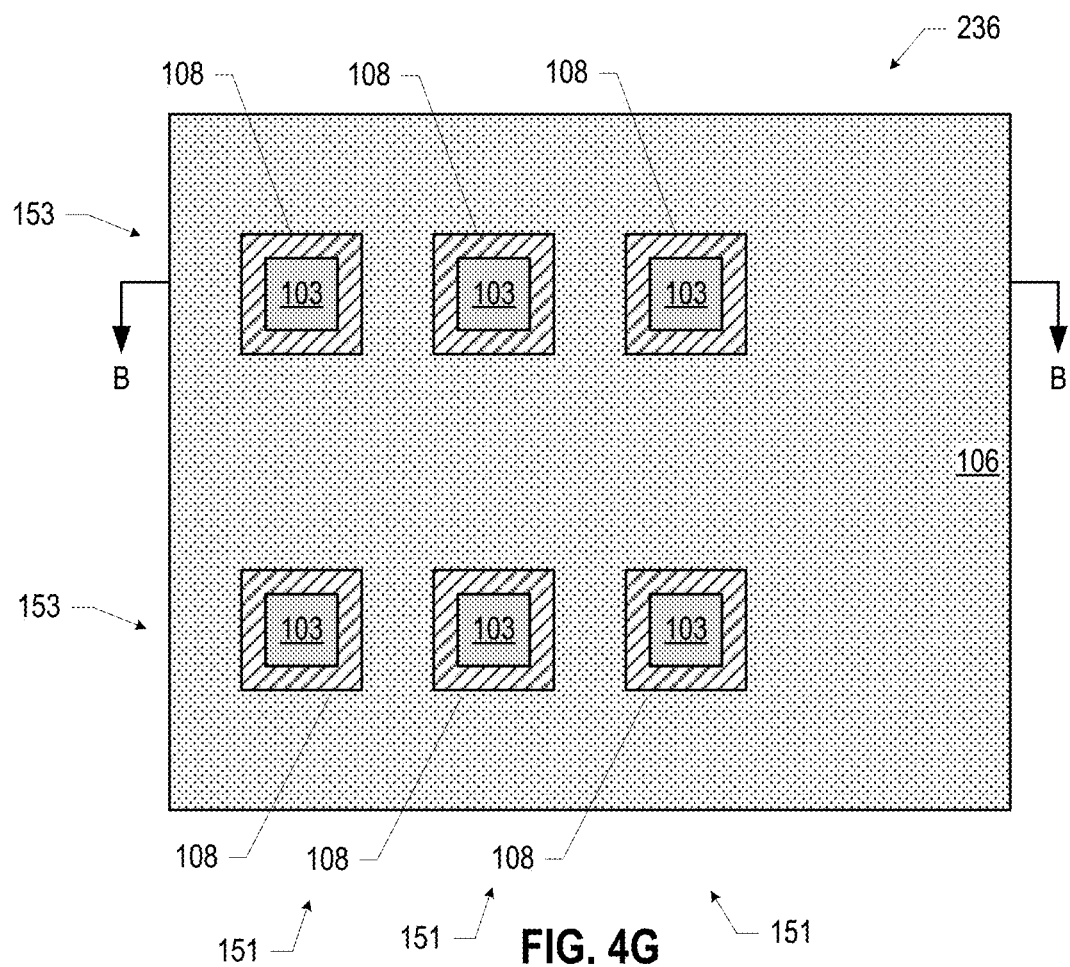

FIG. 4F is a side cross-sectional view of an assembly 236 subsequent to providing insulating material 124 around the pillars 203 of the assembly 234 (FIGS. 4D and 4E), providing the gate dielectric 108 on side faces of the channels 103, and providing the material for the gate electrode 106. These operations and materials may take the form of any of the embodiments discussed above with reference to FIGS. 2F-2J, for example. FIG. 4G is a top cross-sectional view of the assembly 236 (through the section A-A of FIG. 4F) such that the view of FIG. 4F is taken through the section B-B of FIG. 4G.

Figure 4H:
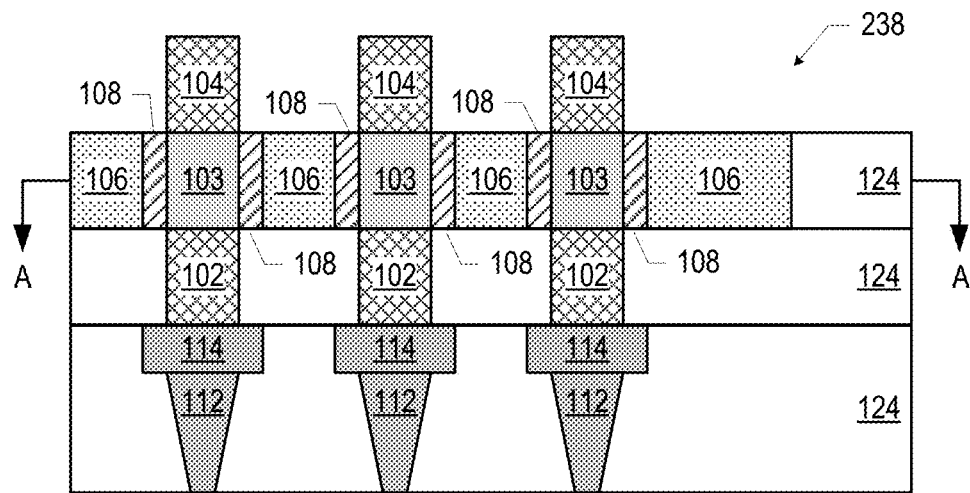
Figure 4I:
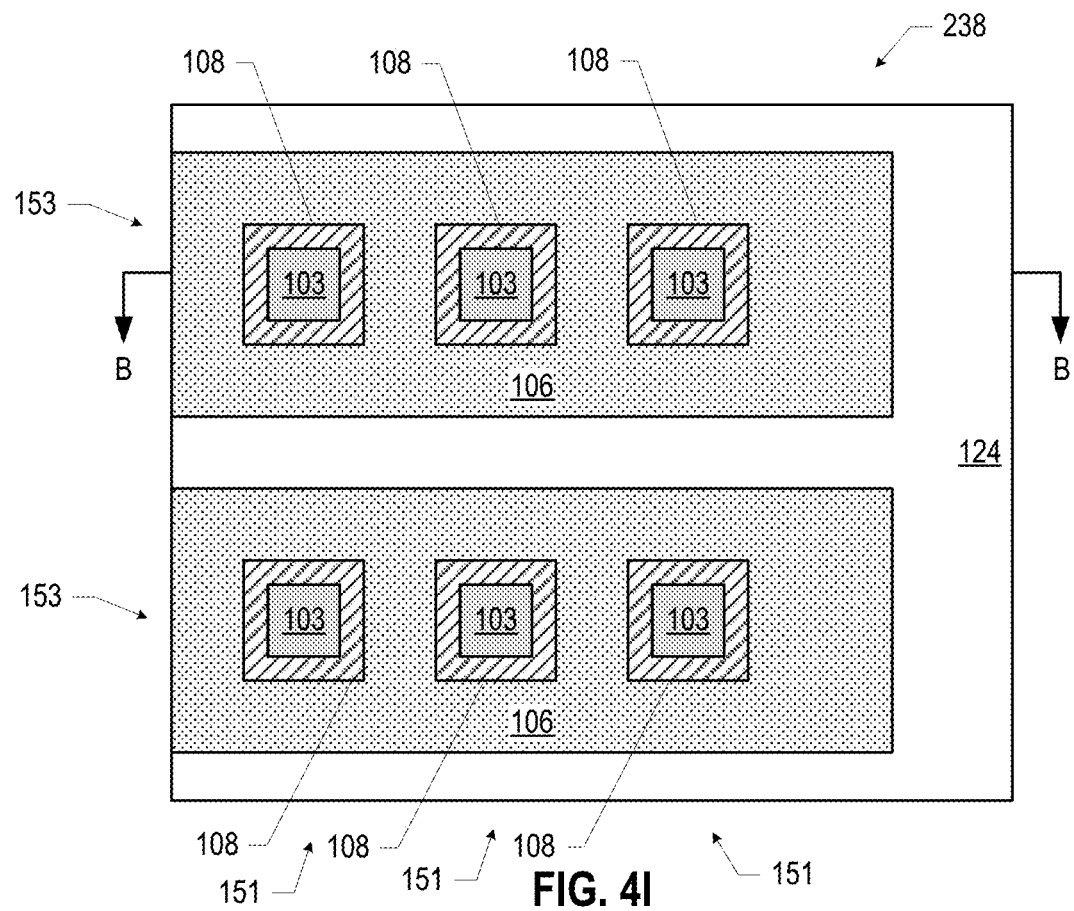

FIG. 4H is a side cross-sectional view of an assembly 238 subsequent to patterning the material for the gate electrode 106 of the assembly 236 (FIGS. 4F and 4G) to form the gate electrodes 106, and providing additional insulating material 124. FIG. 4I is a top cross-sectional view of the assembly 238 (through the section A-A of FIG. 4H) such that the view of FIG. 4H is taken through the section B-B of FIG. 4I. As illustrated in FIG. 4I (and FIG. 3B), a gate electrode 106 may laterally surround the gate dielectrics 108 and may be materially continuous for all of the vertical transistors 100 in a common row 153, and different rows 153 may have materially discontinuous gate electrodes 106. Thus, the gate electrodes 106 of different vertical transistors 100 in a given row 153 may be electrically "tied," and the conductive lines 114 of the conductive pathways 163 of different vertical transistors 100 in a given column 151 may be electrically "tied." The patterning of the material for the gate electrodes 106 may be performed using any of the techniques discussed above with reference to FIG. 2K, for example. Additional interconnect structures (e.g., conductive vias 112 and conductive lines 114 for the conductive pathways 165 and 167) may be formed on the assembly 238 (FIGS. 4H and 4I) to form the electronic device 150 of FIG. 5 (e.g., using any of the techniques discussed above with reference to FIG. 2L). Additionally, any desired further fabrication operations may also be performed. For example, in some embodiments, a storage element may be formed after formation of the vertical transistor 100, and the storage element may be electrically coupled to the S/D contact 104.

In the embodiments discussed above with reference to FIGS. 3 and 4, the conductive lines 114 of the conductive pathways 163 are patterned prior to patterning of the S/D contacts 102. In some embodiments, the conductive lines 114 of the conductive pathways 163 may be patterned as part of a common set of patterning operations with at least the initial patterning of the S/D contacts 102, and thus the conductive lines 114 of the conductive pathways 163 may be said to be "self-aligned" with the S/D contacts 102.

Figure 5A:
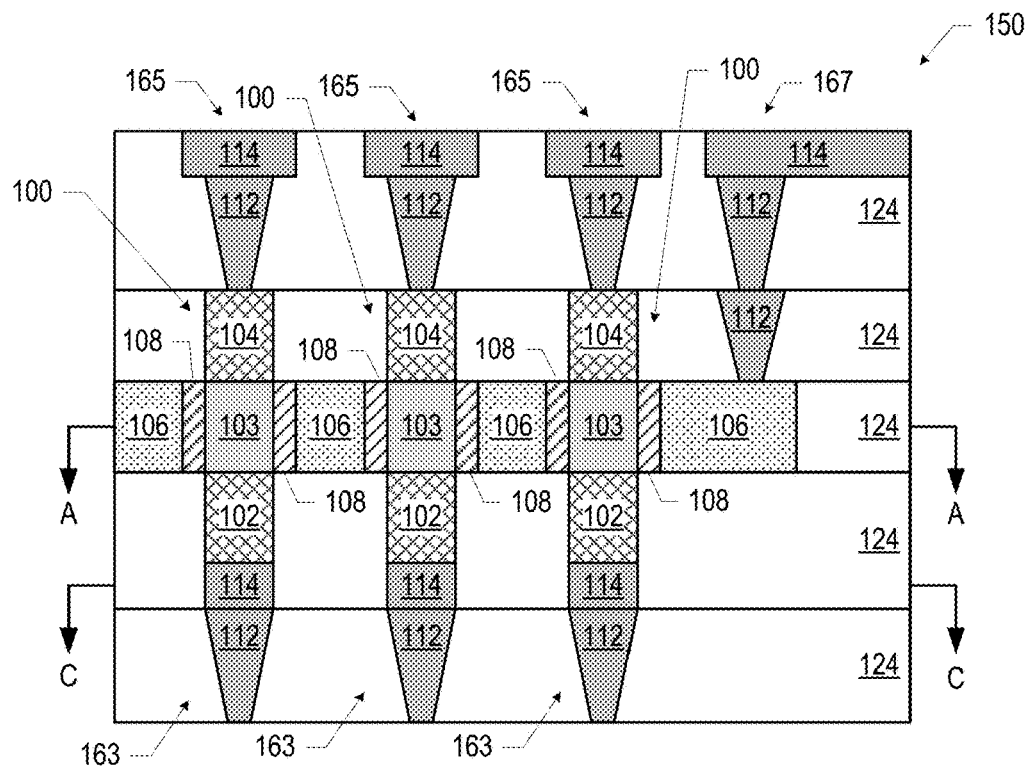
FIGS. 5A-5D are cross-sectional views of an example electronic device including an array of vertical transistors, in accordance with various embodiments.
Figure 5B:
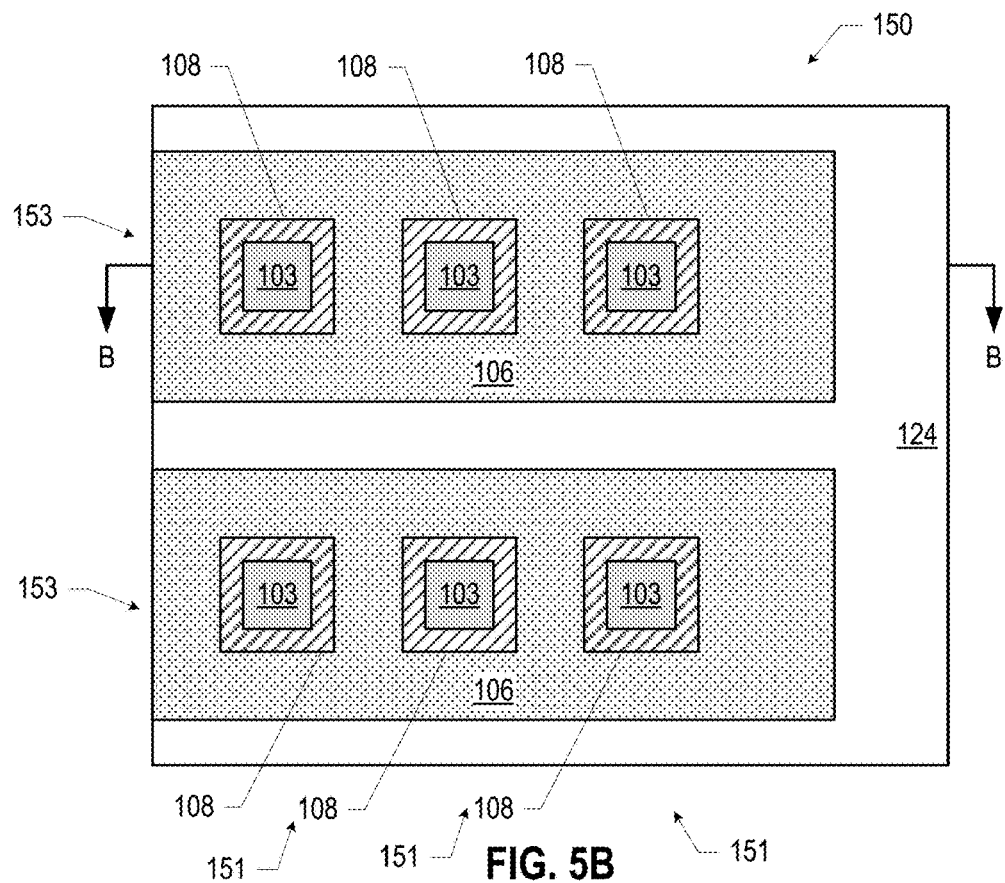
Figure 5C:
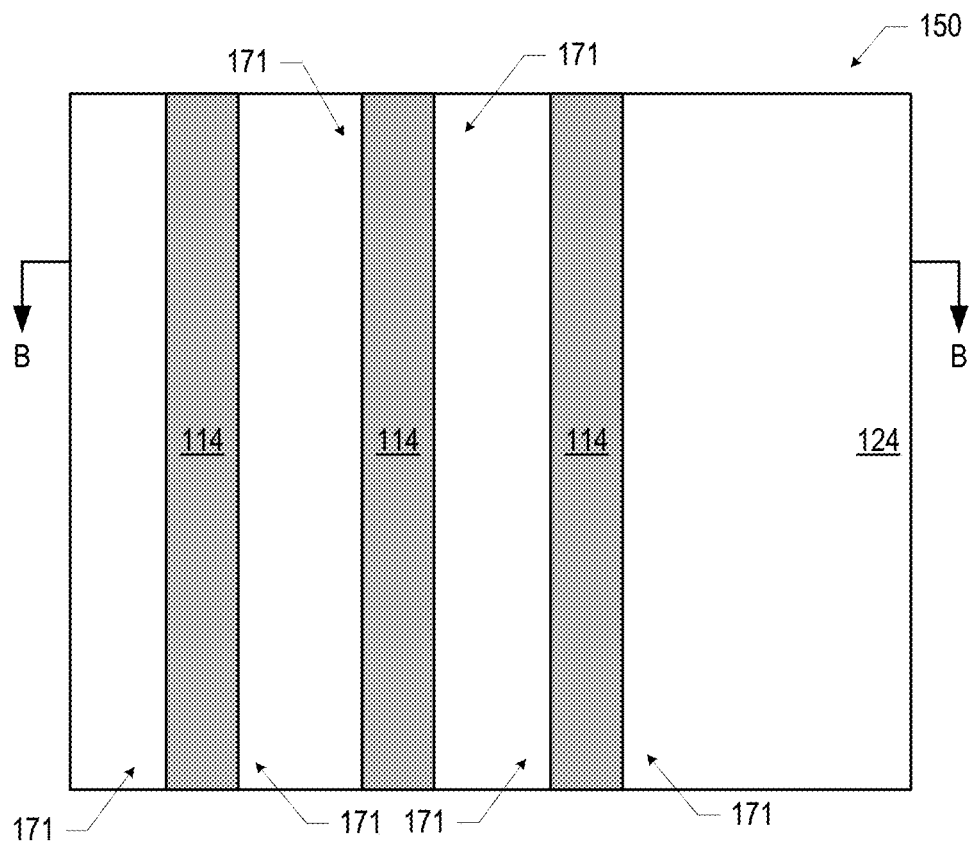
Figure 5D:
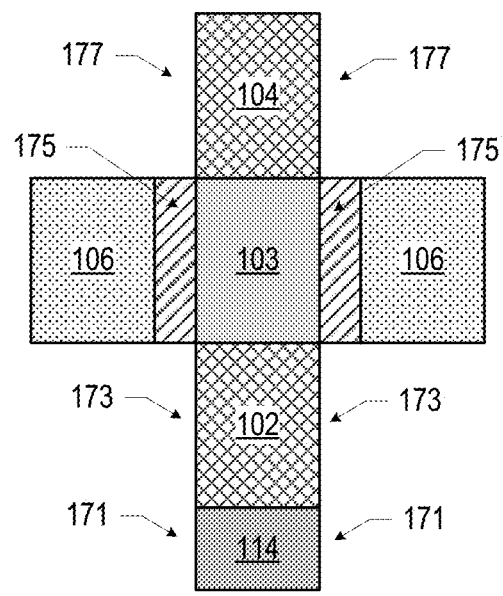

FIGS. 5A-5D are cross-sectional views of an example electronic device 150 including an array of vertical transistors 100 in which the conductive lines 114 of the conductive pathways 163 take the form of parallel ridges with side faces 171 that are substantially aligned with side faces 173 of the S/D contacts 102, in accordance with various embodiments. FIG. 5A is a "side" cross-sectional view (through the section B-B of FIGS. 5B-5C), FIG. 5B is a "top" cross-sectional view (through the section A-A of FIG. 5A), and FIG. 5C is a "top" cross-sectional view (through the section C-C of FIG. 5A). FIG. 5D is a detail view of a portion of FIG. 5A, including reference numerals labeling the side faces of various components of a vertical transistor 100. A number of the components of the electronic device 150 of FIG. 5 may take the form of any of the embodiments of those components discussed elsewhere herein, and thus these components are not discussed again with reference to FIG. 5 for clarity of illustration.

In some embodiments, as illustrated in FIG. 5, the self-alignment may extend all the way up the pillars 203, with the side faces 171 of the conductive lines 114 being aligned with the side faces 173 of the S/D contacts 102, the side faces 175 of the channels 103, and the side faces 177 of the S/D contacts 104.

In embodiments in which the conductive lines 114 of the conductive pathways 163 are patterned along with the S/D contacts 102, the insulating material 124 disposed proximate to the side faces 171 and the side faces 173 may be materially continuous and may be deposited as part of a single operation. In other words, when the conductive lines 114 of the conductive pathways 163 are patterned prior to initial patterning of the S/D contacts 102, the insulating material 124 in the same "layer" as the conductive lines 114 (e.g., the insulating material 124 proximate to the side faces 171) may be deposited in a first set of operations, then the S/D contacts 102 and additional insulating material 124 in the same "layer" as the S/D contacts 102 (e.g., the insulating material 124 proximate to the side faces 173) may be deposited in a second set of operations. In such an embodiment of the electronic device 150, there may be a visible material interface between the insulating material 124 in the same layer as the conductive lines 114 and the insulating material in the same layer as the S/D contacts 102. By contrast, when the conductive lines 114 are patterned in the same set of patterning operations as the initial patterning of the S/D contacts 102, the insulating material 124 may be provided around the conductive lines 114 and the S/D contacts 102 in one deposition operation, and thus there may be no such material interface.

FIGS. 6A-6H illustrate various example stages in the manufacture of the electronic device of FIGS. 5A-5D, in accordance with various embodiments. However, as noted above, the vertical transistors 100 and electronic devices 150 disclosed herein may be formed using any suitable techniques.

Figure 6A:
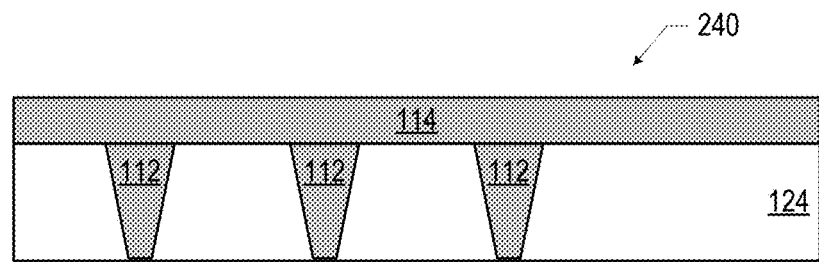
FIGS. 6A-6H illustrate various example stages in the manufacture of the electronic device of FIGS. 5A-5D, in accordance with various embodiments.

FIG. 6A is a side cross-sectional view of an assembly 240 subsequent to forming an interconnect structure including multiple conductive vias 112 (which will become part of corresponding multiple conductive pathways 163, as discussed below). Insulating material 124 may be disposed around the conductive vias 112 in the assembly 240, and the assembly 240 may be formed using any of the techniques discussed above with reference to the assembly 200 of FIG. 2A. The interconnect structure shown in FIG. 6A is simply illustrative, and subsequent operations may be performed on any suitable "starting" assembly. For example, in some embodiments, a storage element may be included in the assembly 240, and may be electrically coupled to the S/D contact 102 during fabrication of the vertical transistor 100, as discussed below.

Figure 6B:
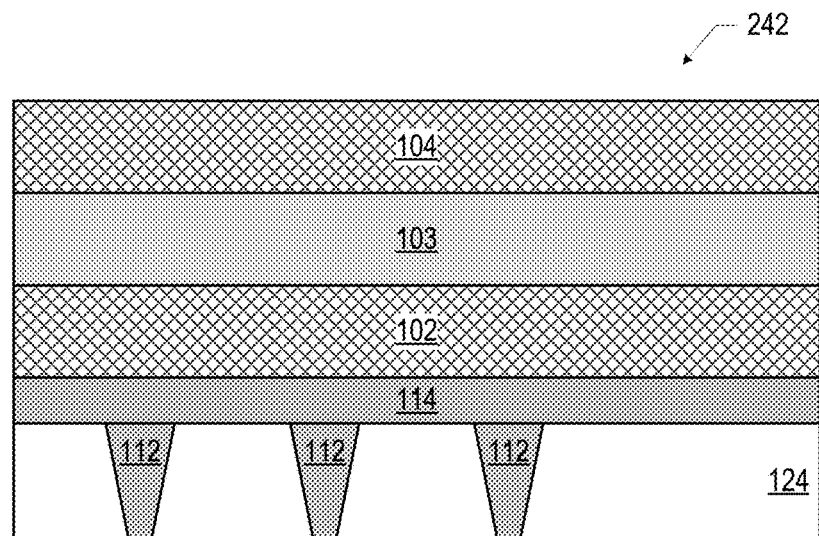

FIG. 6B is a side cross-sectional view of an assembly 242 subsequent to providing material for the conductive lines 114, material for the S/D contacts 102, material for the channels 103, and material for the S/D contacts 104 on the assembly 240 (FIG. 6A). The provision of these materials may take any of the forms discussed above with reference to the assembly 202 of FIG. 2B, including the use of any suitable technique for depositing the material for the conductive lines 114.

Figure 6C:
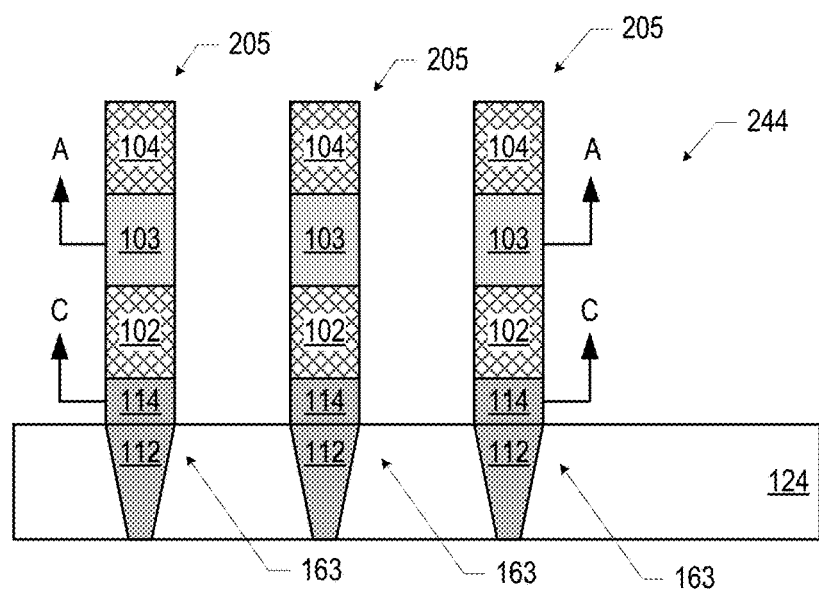
Figure 6D:
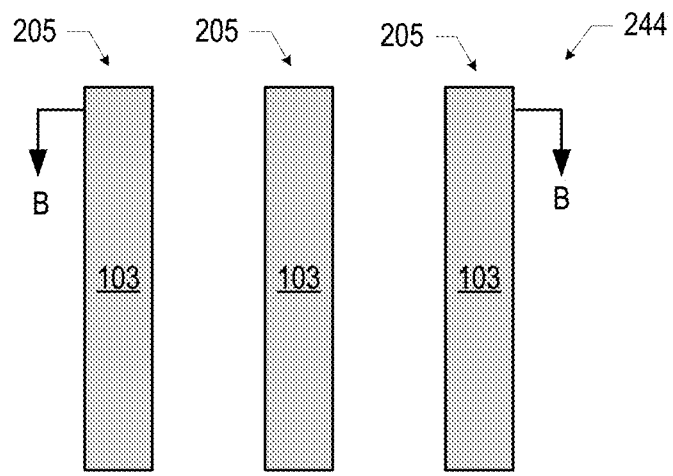

FIG. 6C is a side cross-sectional view of an assembly 244 subsequent to patterning the material for the conductive lines 114, the material for the S/D contact 104, the material for the channel 103, and the material for the S/D contact 102 of the assembly 242 (FIG. 6B) to form multiple ridges 205, each including a conductive line 114, material for an S/D contact 104, material for a channel 103, and material for an S/D contact 102. FIG. 6D is a top cross-sectional view of the assembly 244 (through the section A-A of FIG. 6C) such that the view of FIG. 6C is taken through the section B-B of FIG. 6D, and FIG. 6E is a top cross-sectional view of the assembly 244 (through the section C-C of FIG. 6C) such that the view of FIG. 6C is taken through the section B-B of FIG. 6E.

Figure 6E:
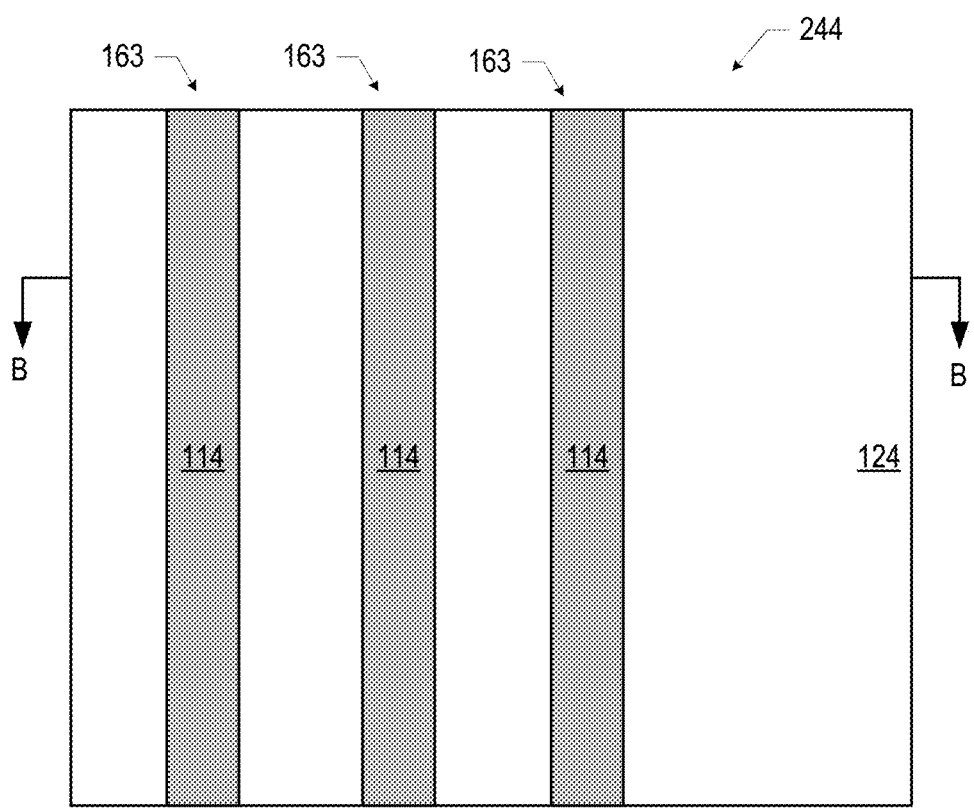
Figure 6F:
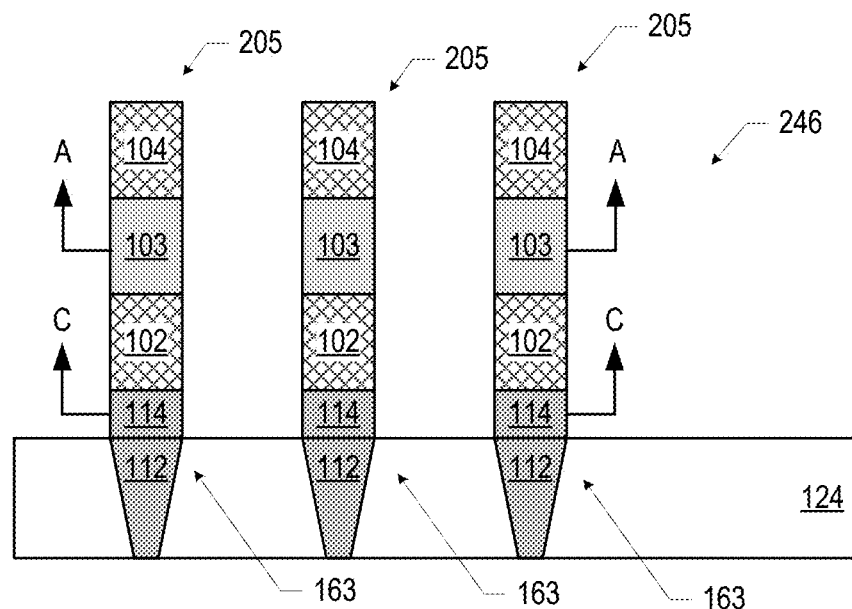
Figure 6G:
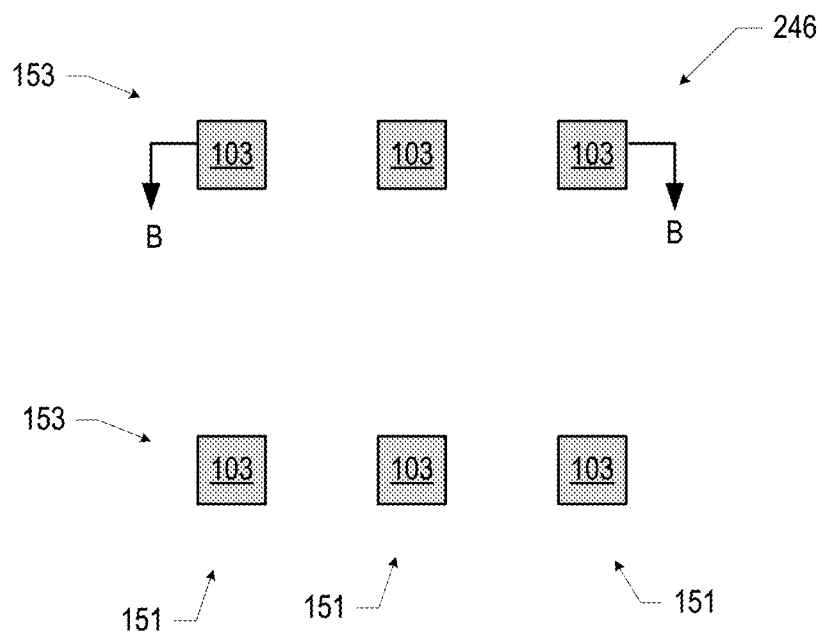
Figure 6H:
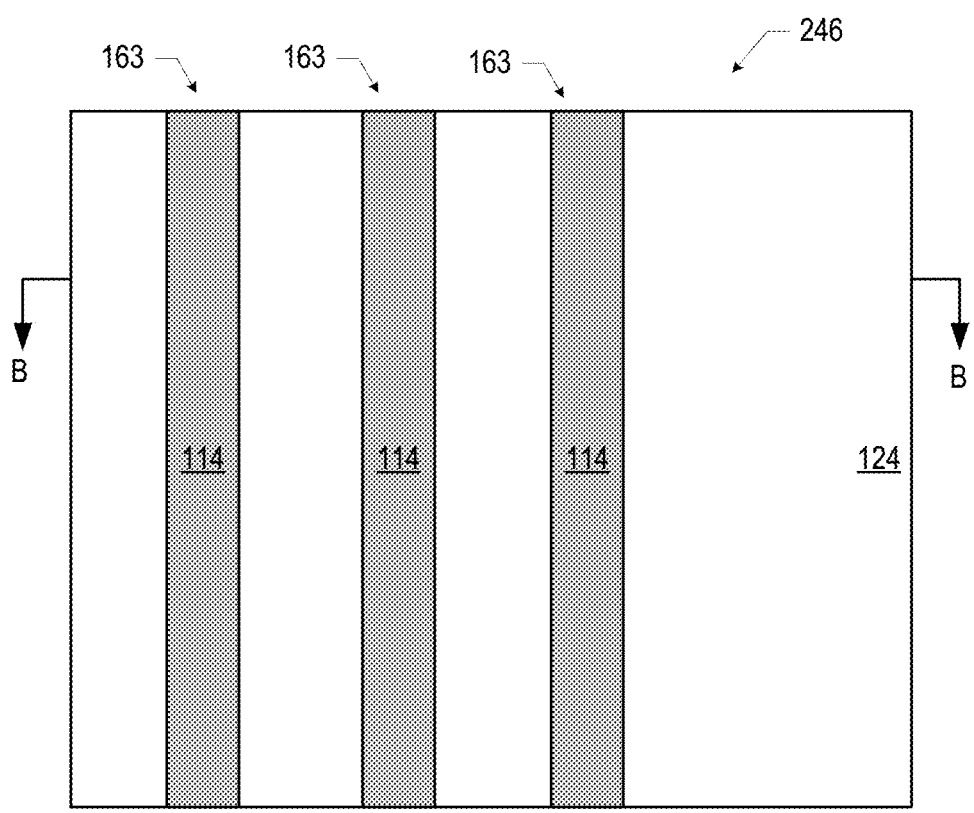

FIG. 6F is a side cross-sectional view (from the same perspective as FIG. 6C) of an assembly 246 subsequent to performing additional patterning to form pillars 203 from the ridges 205 of the assembly 244 (FIGS. 6C-6E). FIG. 6G is a top cross-sectional view of the assembly 246 (through the section A-A of FIG. 6F) such that the view of FIG. 6F is taken through the section B-B of FIG. 6G, and FIG. 6H is a top cross-sectional view of the assembly 246 (through the section C-C of FIG. 6F) such that the view of FIG. 6F is taken through the section B-B of FIG. 6H. The pillars 203 include the S/D contacts 102, the channels 103, and the S/D contacts 104, and are arranged in an array of rows 153 and columns 151, as discussed above. The patterning illustrated in FIGS. 6F-6H "stops" at the S/D contacts 102, and the conductive lines 114 of the assembly 244 are not further patterned to form the assembly 246 (as illustrated in FIGS. 6G and 6H). The formation of the pillars 203 may take any of the forms discussed above with reference to FIGS. 2C and 2D, for example. The assembly 246 may be further processed to provide gate dielectric 108, gate electrodes 106, and conductive pathways 165 and 167 to form the electronic device 150 of FIG. 5 (e.g., in accordance with any of the techniques discussed above with reference to FIGS. 4F-4I). Additionally, any desired further fabrication operations may also be performed. For example, in some embodiments, a storage element may be formed after formation of the vertical transistor 100, and the storage element may be electrically coupled to the S/D contact 104.

Figure 7A:
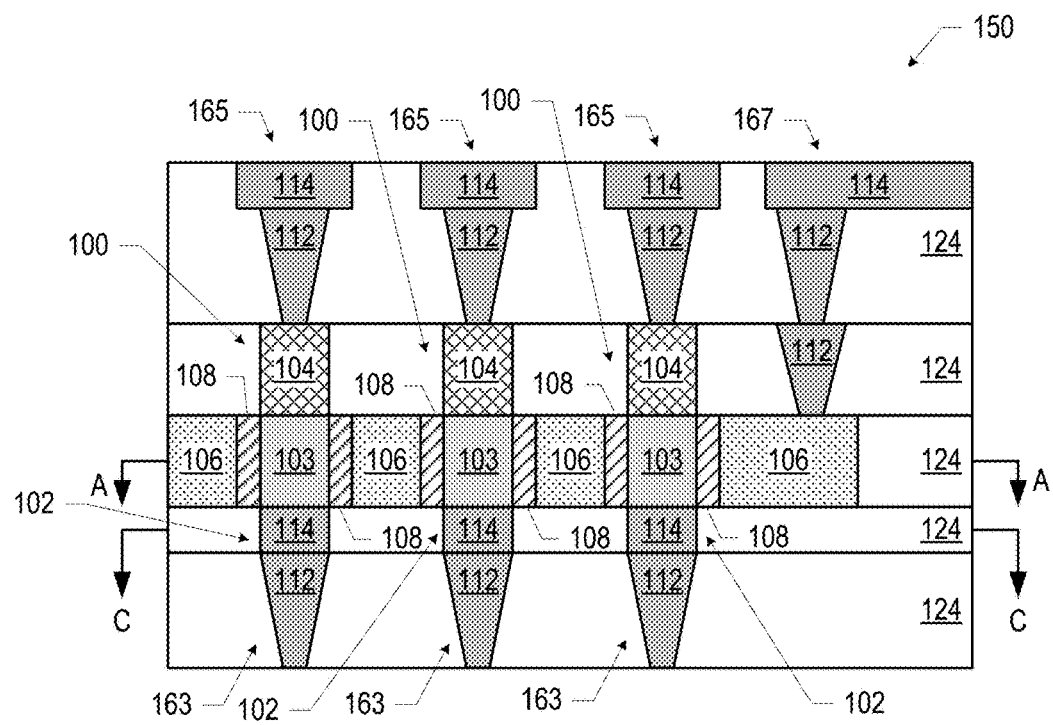
FIGS. 7A-7C are cross-sectional views of an example electronic device including an array of vertical transistors, in accordance with various embodiments.
Figure 7B:
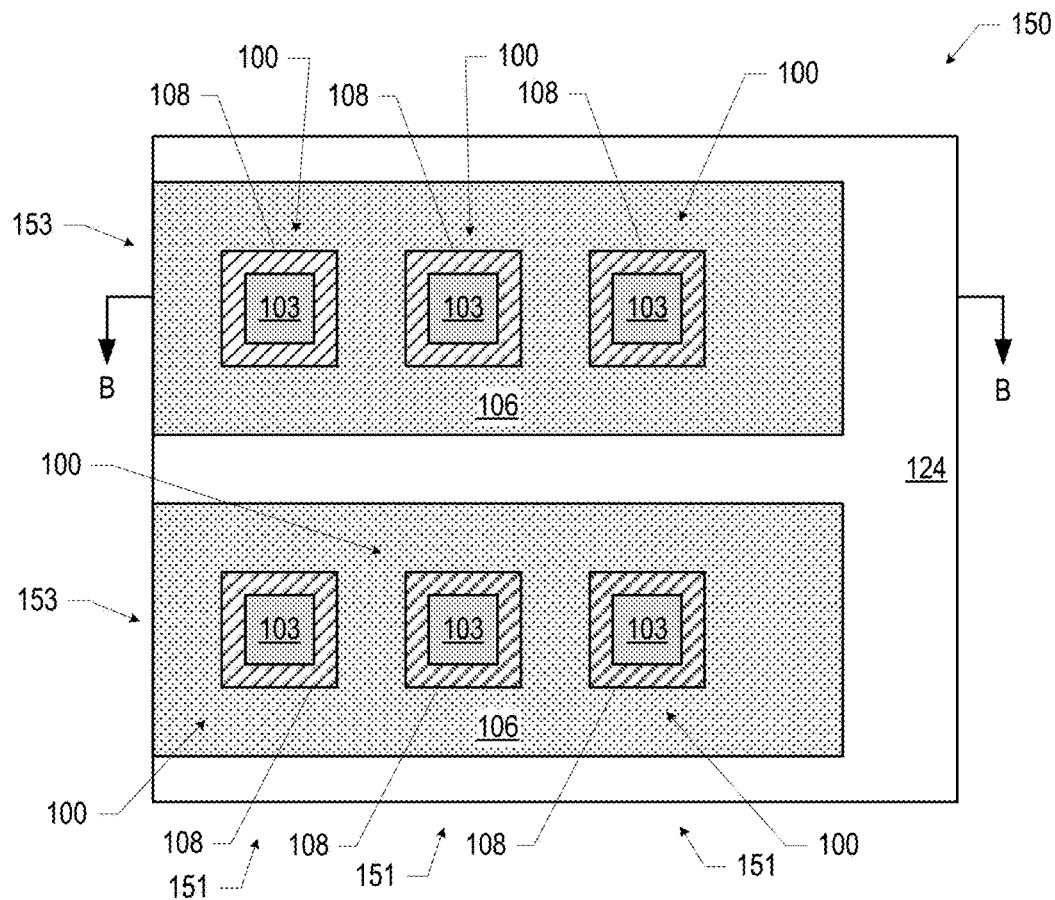
Figure 7C:
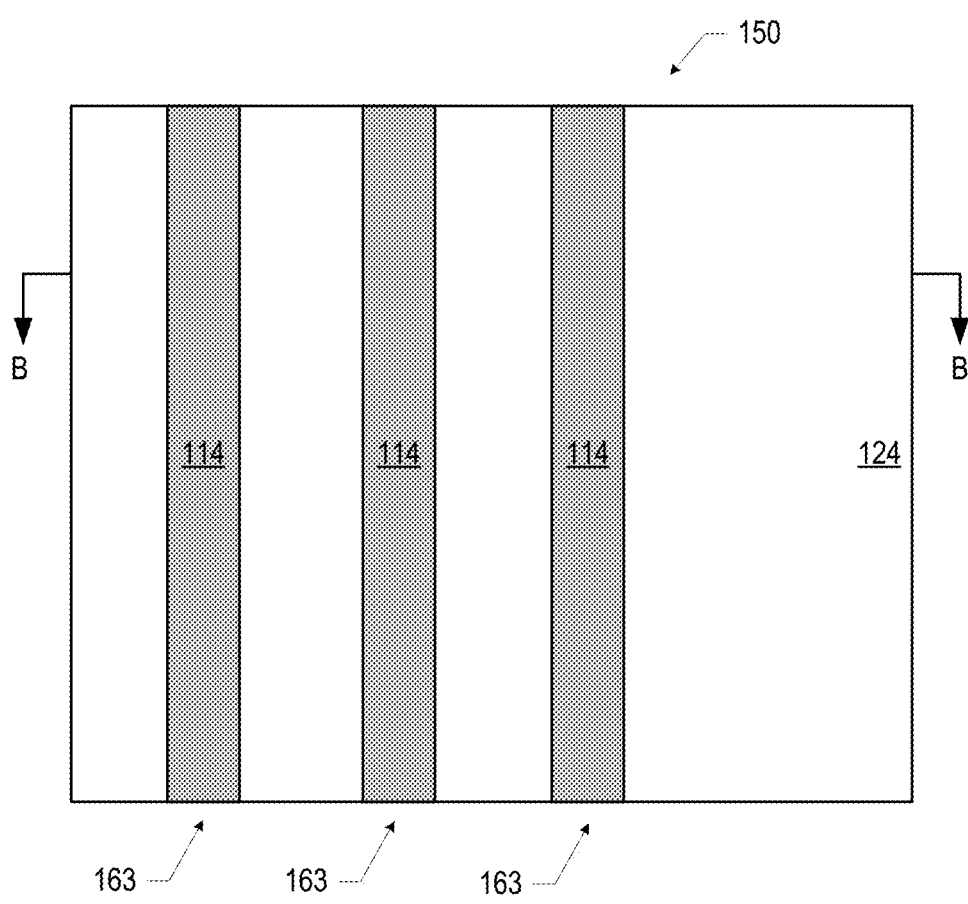

In the embodiments illustrated in FIGS. 1, 3, and 5, the S/D contacts 102 take the form of "pedestals" extending away from conductive lines 114 of the conductive pathways 163. In some embodiments, the conductive lines 114 may themselves provide the S/D contacts 102; in other words, the conductive lines 114 may directly contact the channels 103, without any intervening material. FIGS. 7A-7C are cross-sectional views of an example electronic device 150 including an array of vertical transistors 100 in which the S/D contacts 102 are provided by the conductive lines 114 of the conductive pathways 163, in accordance with various embodiments. FIG. 7A is a "side" cross-sectional view (through the section B-B of FIGS. 7B-7C), FIG. 7B is a "top" cross-sectional view (through the section A-A of FIG. 7A), and FIG. 7C is a "top" cross-sectional view (through the section C-C of FIG. 7A). A number of the components of the electronic device 150 of FIG. 7 may take the form of any of the embodiments of those components discussed elsewhere herein, and thus these components are not discussed again with reference to FIG. 7 for clarity of illustration. Any suitable techniques may be used to manufacture the electronic device 150 of FIG. 7. For example, the electronic device 150 of FIG. 7 may be manufactured substantially in accordance with the operations discussed above with reference to FIG. 6, but the separate material layer for the S/D contact 102 may be omitted; instead, the material for the conductive lines 114 may abut the material for the channels 103.

Figure 8:
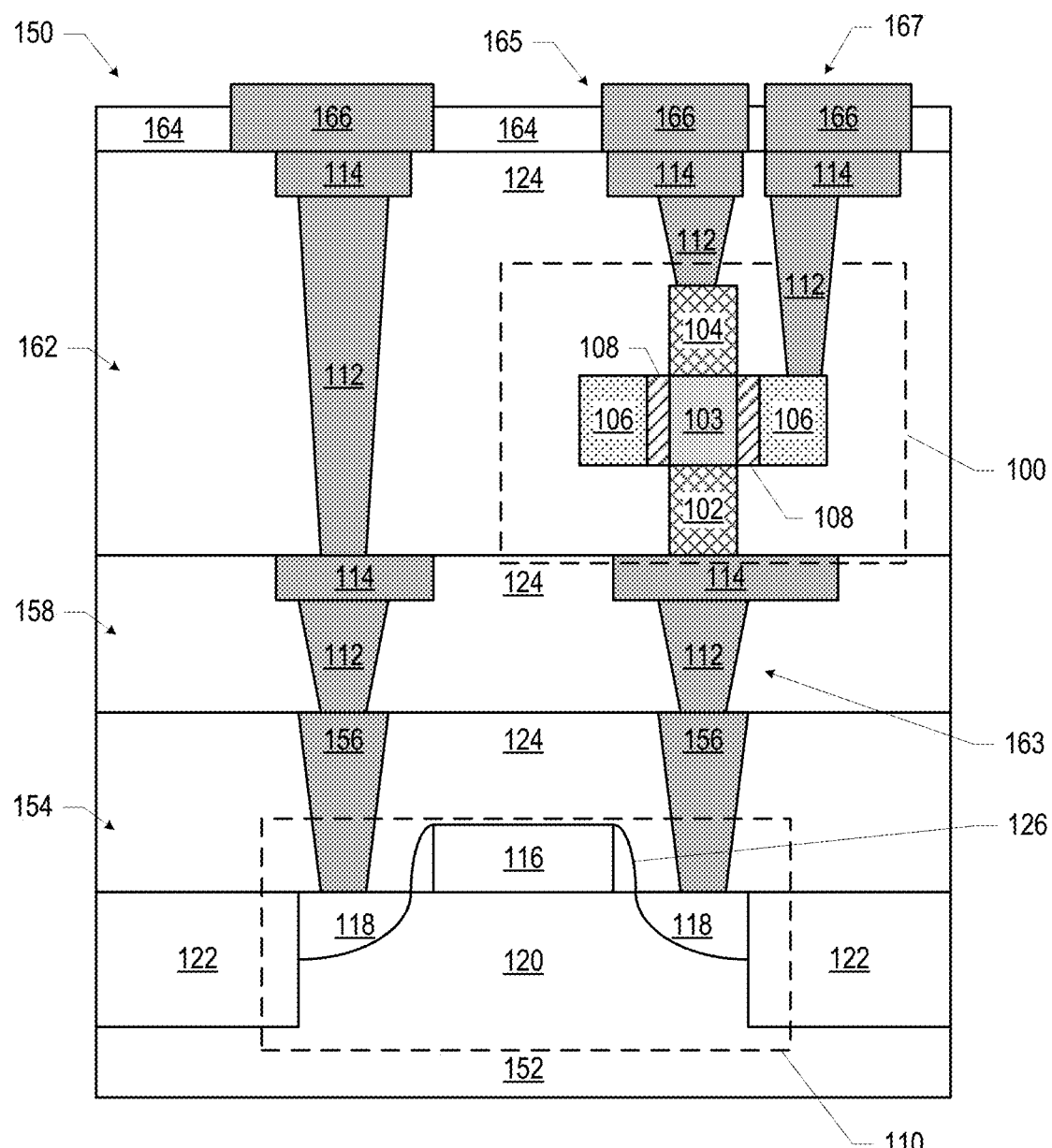
FIG. 8 is a cross-sectional view of an example electronic device including a vertical transistor, in accordance with various embodiments.

FIG. 8 is a side cross-sectional view of an example electronic device 150 including a vertical transistor 100, in accordance with various embodiments. Although the vertical transistor 100 illustrated in FIG. 8 takes the form of the vertical transistor 100 of FIG. 1, any of the vertical transistors 100 disclosed herein may be included in the electronic device 150 of FIG. 8. The electronic device 150 of FIG. 8 also illustrates a transistor 110 to which the vertical transistor 100 is coupled, in accordance with various embodiments. As discussed in detail below, the transistor 110 may be a "front-end" transistor (i.e., formed as part of front-end fabrication operations), and the vertical transistor 100 may be a "back-end" transistor (i.e., formed as part of back-end fabrication operations). Any of the embodiments of the components of the electronic device 150 illustrated in FIG. 8 (e.g., the conductive vias 112, the conductive lines 114) may be included in any of the electronic devices 150 disclosed herein (e.g., the electronic devices 150 discussed above with reference to FIGS. 1, 3, 5, and 7).

The electronic device 150 may be formed on a substrate 152 (e.g., the wafer 450 of FIG. 12A, discussed below) and may be included in a die (e.g., the die 452 of FIG. 12B, discussed below). The substrate 152 may be a semiconductor substrate composed of semiconductor material systems including, for example, n-type or p-type material systems. The substrate 152 may include, for example, a crystalline substrate formed using a bulk silicon or a silicon-on-insulator substructure. In some embodiments, the semiconductor substrate 152 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the substrate 152. Although a few examples of materials from which the substrate 152 may be formed are described here, any material that may serve as a foundation for an electronic device 150 may be used. The substrate 152 may be part of a singulated die (e.g., the dies 452 of FIG. 12B) or a wafer (e.g., the wafer 450 of FIG. 12A).

The electronic device 150 may include one or more device layers 154 disposed on the substrate 152. The device layer 154 may include features of one or more transistors 110 (e.g., metal oxide semiconductor field-effect transistors (MOSFETs)) formed on the substrate 152. The device layer 154 may include, for example, one or more source and/or drain (S/D) regions 118, a gate 116 to control current flow in the channel 120 of the transistors 110 between the S/D regions 118, and one or more S/D contacts 156 (which may take the form of conductive vias) to route electrical signals to/from the S/D regions 118. Adjacent transistors 110 may be isolated from each other by a shallow trench isolation (STI) insulating material 122, in some embodiments. The transistors 110 may include additional features not depicted for the sake of clarity, such as device isolation regions, gate contacts, and the like. The transistors 110 are not limited to the type and configuration depicted in FIG. 8 and may include a wide variety of other types and configurations such as, for example, planar transistors, nonplanar transistors, or a combination of both. Nonplanar transistors may include FinFET transistors, such as double-gate transistors or tri-gate transistors, and wrap-around or all-around gate transistors, such as nanoribbon and nanowire transistors.

Each transistor 110 may include a gate 116 including a gate dielectric and a gate electrode. The gate electrode of the transistor 110 may include at least one p-type work function metal or n-type work function metal, depending on whether the transistor 110 is to be a p-type metal oxide semiconductor (PMOS) transistor or an n-type metal oxide semiconductor (NMOS) transistor. For a PMOS transistor, metals that may be used for the gate electrode of the transistor 110 may include, but are not limited to, ruthenium, palladium, platinum, cobalt, nickel, and conductive metal oxides (e.g., ruthenium oxide). For an NMOS transistor, metals that may be used for the gate electrode of the transistor 110 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode of the transistor 110 may consist of a stack of two or more metal layers, where one or more metal layers are work function metal layers and at least one metal layer is a fill metal layer. Further metal layers may be included for other purposes, such as to act as a barrier layer. Any of the materials discussed herein with reference to the gate electrode of the transistor 110 may be used for the gate electrode 106 of the vertical transistor 100.

The gate dielectric of the transistor 110 may be, for example, silicon oxide, aluminum oxide, or a high-k dielectric, such as hafnium oxide. More generally, the gate dielectric of the transistor 110 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric of the transistor 110 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric of the transistor 110 to improve the quality of the gate dielectric of the transistor 110. Any of the materials discussed herein with reference to the gate dielectric of the transistor 110 may be used for the gate dielectric 108 of the vertical transistor 100.

In some embodiments, when viewed as a cross section of the transistor 110 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode of the transistor 110 may simply be a planar layer that is substantially parallel to the top surface of the substrate and does not include sidewall portions substantially perpendicular to the top surface of the substrate. In other embodiments, the gate electrode of the transistor 110 may consist of a combination of U-shaped structures and planar non-U-shaped structures. For example, the gate electrode of the transistor 110 may consist of one or more U-shaped metal layers formed atop one or more planar non-U-shaped layers. In some embodiments, the gate electrode may consist of a V-shaped structure.

In some embodiments, a pair of sidewall spacers 126 may be formed on opposing sides of the gate 116 to bracket the gate 116. The sidewall spacers 126 may be formed from a material such as silicon nitride, silicon oxide, silicon carbide, silicon nitride doped with carbon, and silicon oxynitride. Processes for forming sidewall spacers 126 are well known in the art and generally include deposition and etching process steps. In some embodiments, multiple pairs of sidewall spacers 126 may be used; for instance, two pairs, three pairs, or four pairs of sidewall spacers 126 may be formed on opposing sides of the gate stack.

The S/D regions 118 may be formed within the substrate 152 adjacent to the gate 116 of each transistor 110. For example, the S/D regions 118 may be formed using either an implantation/diffusion process or a deposition process. In the former process, dopants such as boron, aluminum, antimony, phosphorous, or arsenic may be ion-implanted into the substrate 152 to form the S/D regions 118. An annealing process that activates the dopants and causes them to diffuse farther into the substrate 152 may follow the ion-implantation process. In the latter process, an epitaxial deposition process may provide material that is used to fabricate the S/D regions 118. In some implementations, the S/D regions 118 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 118 may be formed using one or more alternate semiconductor materials such as germanium or a group III-V material or alloy. In further embodiments, one or more layers of metal and/or metal alloys may be used to form the S/D regions 118. In some embodiments, an etch process may be performed before the epitaxial deposition to create recesses in the substrate 152 in which the material for the S/D regions 118 is deposited. Any suitable ones of the processes discussed herein with reference to forming the S/D regions 118 of the transistor 110 may be used to form the S/D contacts 102 and 104 in embodiments in which the S/D contacts 102 and 104 include a doped material.

Electrical signals, such as power and/or input/output (I/O) signals, may be routed to and/or from the transistors 110 of the device layer 154, and/or to and/or from the vertical transistors 100, through one or more interconnect layers disposed on the device layer 154 (illustrated in FIG. 8 as interconnect layers 158 and 162). For example, electrically conductive features of the device layer 154 (e.g., the gate 116 and the S/D contacts 156) and/or the vertical transistor 100 (e.g., the gate electrode 106 and the S/D contacts 102 and 104) may be electrically coupled with the interconnect structures including conductive vias 112 and/or conductive lines 114 of the interconnect layers 158 and 162. The one or more interconnect layers 158 and 162 may form an interlayer dielectric (ILD) stack of the electronic device 150. As discussed herein, the vertical transistor 100 may itself be included in the ILD stack as a "back-end" device. In some embodiments, an array of vertical transistors 100 may take the place of conductive vias and lines in a portion of the ILD stack. In some embodiments, an array of vertical transistors 100 may share "layers" in an ILD stack with conductive vias and/or lines (e.g., an array of vertical transistors 100 may be arranged laterally with conductive vias and/or lines in the ILD stack).

The interconnect structures may be arranged within the interconnect layers 158 and 162 to route electrical signals according to a wide variety of designs (in particular, the arrangement is not limited to the particular configuration of interconnect structures depicted in FIG. 8). Although a particular number of interconnect layers is depicted in FIG. 8, embodiments of the present disclosure include electronic devices having more or fewer interconnect layers than depicted.

In some embodiments, the interconnect structures may include conductive lines 114 (sometimes referred to as "trench structures") and/or conductive vias 112 (sometimes referred to as "holes") filled with an electrically conductive material such as a metal. The conductive lines 114 may be arranged to route electrical signals in a direction of a plane that is substantially parallel with a surface of the substrate 152 upon which the device layer 154 is formed. For example, the conductive lines 114 may route electrical signals in a direction in and out of the page from the perspective of FIG. 8. The conductive vias 112 may be arranged to route electrical signals in a direction of a plane that is substantially perpendicular to the surface of the substrate 152 upon which the device layer 154 is formed. In some embodiments, the conductive vias 112 may electrically couple conductive lines 114 of different interconnect layers 158 and 162 together.

The interconnect layers 158 and 162 may include an insulating material 124 disposed between the interconnect structures, as shown in FIG. 8. In some embodiments, the insulating material 124 disposed between the interconnect structures in different ones of the interconnect layers 158 and 162 may have different compositions; in other embodiments, the composition of the insulating material 124 between different interconnect layers 158 and 162 may be the same. The insulating material 124 may be a dielectric material, such as silicon dioxide. In some embodiments, the insulating material 124 may be any suitable interlayer dielectric (ILD) material.

A first interconnect layer 158 (referred to as Metal 1 or "M1") may be formed directly on the device layer 154. In some embodiments, the first interconnect layer 158 may include conductive lines 114 and/or conductive vias 112, as shown. The conductive lines 114 of the first interconnect layer 158 may be coupled with contacts (e.g., the S/D contacts 156) of the device layer 154.

A second interconnect layer 162 (referred to as Metal 2 or "M2") may be formed directly on the first interconnect layer 158. In some embodiments, the second interconnect layer 162 may include conductive vias 112 to couple the conductive lines 114 of the second interconnect layer 162 with the conductive lines 114 of the first interconnect layer 158. Although the conductive lines 114 and the conductive vias 112 are structurally delineated with a line within each interconnect layer (e.g., within the second interconnect layer 162) for the sake of clarity, the conductive lines 114 and the conductive vias 112 may be structurally and/or materially contiguous (e.g., simultaneously filled during a dual-damascene process) in some embodiments.

Additional interconnect layers may be formed in succession on the second interconnect layer 162 according to similar techniques and configurations described in connection with the first interconnect layer 158 or the second interconnect layer 162.

The electronic device 150 may include a solder resist material 164 (e.g., polyimide or similar material) and one or more bond pads 166 formed on the interconnect layers. The bond pads 166 may be electrically coupled with the interconnect structures and may route the electrical signals of the electronic device 150 to other external devices. For example, solder bonds may be formed on the one or more bond pads 166 to mechanically and/or electrically couple a chip including the electronic device 150 with another component (e.g., a circuit board). The electronic device 150 may include other structures to route the electrical signals from the interconnect layers than depicted in other embodiments. For example, the bond pads 166 may be replaced by or may further include other analogous features (e.g., posts) that route electrical signals to external components.

As noted above, the electronic device 150 may include a vertical transistor 100, which may be electrically coupled to a transistor 110. The vertical transistor 100 is illustrated as being included in the second interconnect layer 162, but the vertical transistor 100 may be located in any suitable interconnect layer or other portion of the electronic device 150. As discussed elsewhere herein, the electronic device 150 may include a storage element 130 (not shown) to which the vertical transistor 100 is coupled; the storage element 130 and the vertical transistor 100 may together act as a memory cell 131.

Figure 9A:
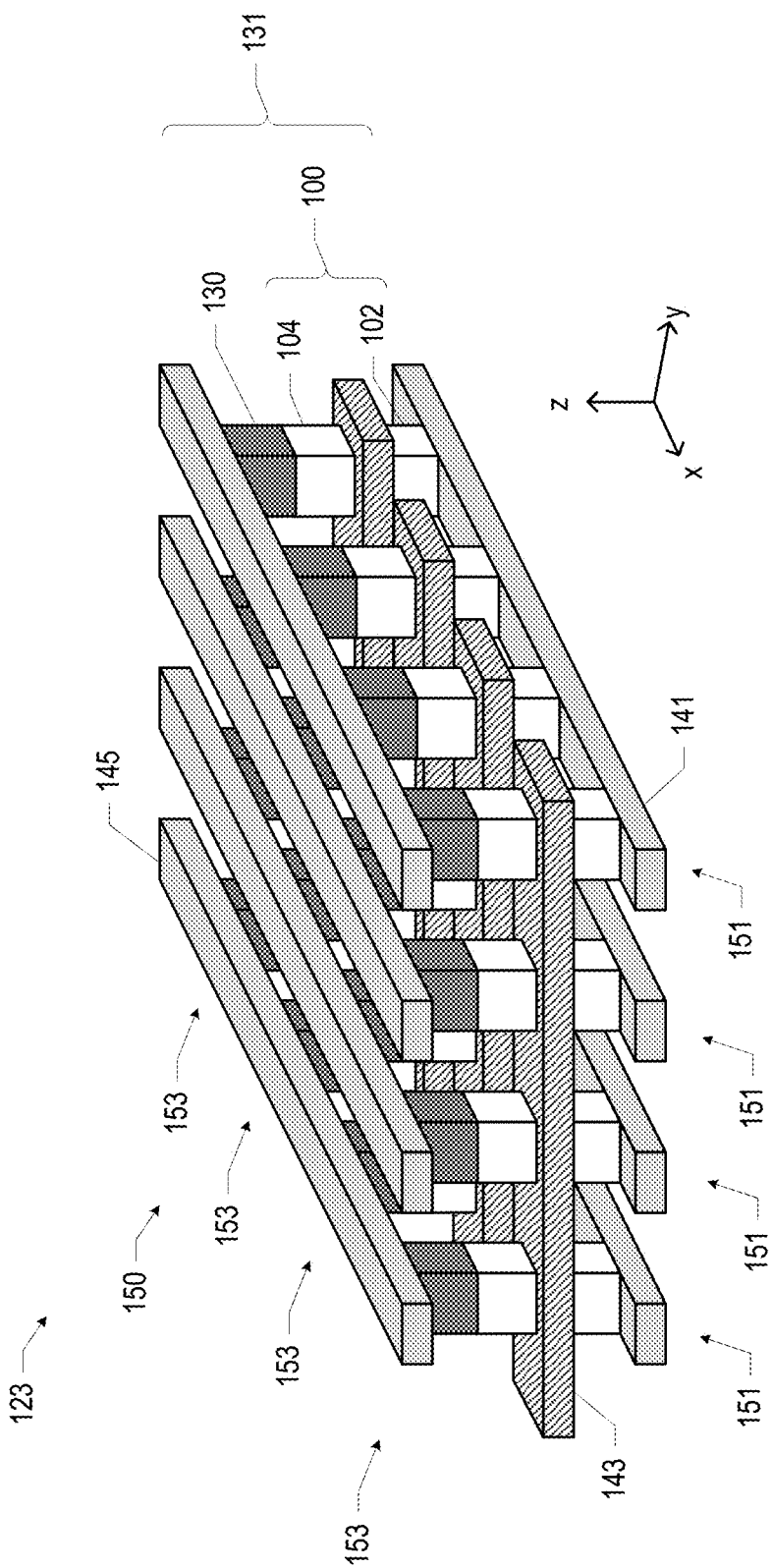
FIGS. 9A and 9B are each perspective views of a portion of a memory device including vertical transistors, in accordance with various embodiments.
Figure 9B:
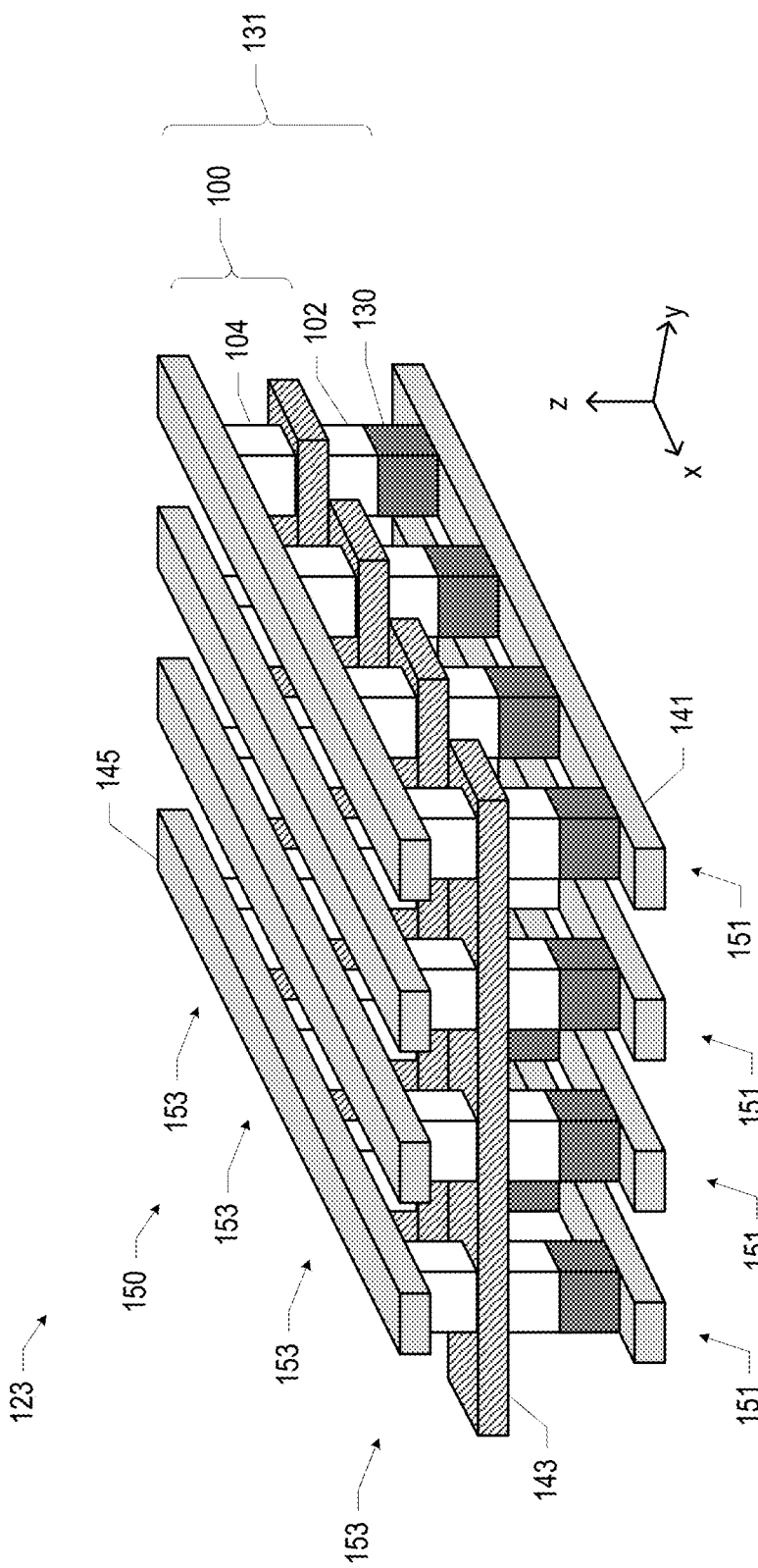

As noted above, in some embodiments, the vertical transistors 100 disclosed herein may be included in a memory device. FIGS. 9A and 9B are each perspective views of a portion of a memory device 123 that may be included in any of the electronic devices 150 disclosed herein, in accordance with various embodiments. The memory device 123 may be a cross-point array including memory cells 131 located at the intersections of conductive lines 141 and conductive lines 143. Conductive vias (not shown) to the conductive lines 141 and the conductive lines 143 may be made at the "edges" of the memory device 123. In some embodiments, the conductive lines 143 may be word lines and the conductive lines 141 may be bit lines, for example; for clarity of discussion, this terminology may be used herein to refer to the conductive lines 143 and the conductive lines 141. The memory device 123 may also include a set of conductive lines 145 whose arrangement may mirror the arrangement of the bit lines 141; for clarity of discussion, the conductive lines 145 may also be referred to herein as bit lines 145.

In the embodiments illustrated in FIGS. 9A and 9B, the word lines 143 may be parallel to each other and may be arranged perpendicularly to the bit lines 141/145 (which themselves may be parallel to each other), but any other suitable arrangement may be used. The word lines 143 and/or the bit lines 141/145 may be formed of any suitable conductive material, such as a metal (e.g., tungsten, copper, titanium, or aluminum). In some embodiments, the memory device 123 depicted in FIG. 9 may be a portion (e.g., a level) of a three-dimensional array in which other memory arrays like the memory device 123 of FIG. 9 are located at different levels (e.g., above or below the memory device 123).

Each memory cell 131 may include a storage element 130 coupled in series with an associated vertical transistor 100. Generally, the storage element 130 may be programmed to a target data state (e.g., corresponding to a particular resistance state) by applying an electric field or energy (e.g., positive or negative voltage or current pulses) for a particular duration, under the control of the vertical transistor 100. In some embodiments, the storage element 130 may include a memory material disposed between a pair of electrodes, for example. The storage element 130 may be, for example, a resistive storage element that, during operation, switches between two different nonvolatile states: a high resistance state (HRS) and a low resistance state (LRS). The state of a resistive storage element may be used to represent a data bit (e.g., a "1" for HRS and a "0" for LRS, or vice versa). A resistive storage element may have a voltage threshold beyond which the resistive storage element is in the LRS; driving a resistive storage element into the LRS may be referred to as SET (with an associated SET threshold voltage). Similarly, a resistive storage element may have a voltage threshold beyond which the resistive storage element is in the HRS; driving a resistive storage element into the HRS may be referred to as RESET (with an associated RESET threshold voltage).

The storage element 130 may be, for example, a resistive random access memory (RRAM) device; in such embodiments, the memory material may include an oxygen exchange layer (e.g., hafnium) and an oxide layer, as known in the art. The storage element 130 may be, for example, a metal filament memory device (e.g., a conductive bridging random access memory (CBRAM) device); in such embodiments, the memory material may include a solid electrolyte, one of the electrodes in the pair of electrodes may be an electrochemically active metal (e.g., silver or copper), and the other of the electrodes in the pair of electrodes may be an inert metal, as known in the art. A chemical barrier layer (e.g., tantalum, tantalum nitride, or tungsten) may be disposed between the electrochemically active metal electrode and the solid electrolyte to mitigate diffusion of the electrochemically active metal into the solid electrolyte, in some such embodiments. In some embodiments, the storage element 130 may be a phase change memory (PCM) device; in such embodiments, the memory material may include a chalcogenide or other phase change memory material.

The vertical transistor 100 may control the flow of current through the storage element 130. In the embodiment illustrated in FIG. 9A, the S/D contact 104 may be electrically coupled between the channel 103 and the storage element 130. In some such embodiments, the S/D contact 104 of the vertical transistor 100 may itself provide the "bottom" electrode of the storage element 130, as suggested in FIG. 9A. In the embodiment illustrated in FIG. 9A, the bit lines 141 may be provided by the conductive lines 114 of the conductive pathways 163 of the electronic devices 150 discussed herein, and the word lines 143 may be provided by the gate electrodes 106 of the electronic devices 150 discussed herein.

In the embodiment illustrated in FIG. 9B, the relative positions of the storage elements 130 and the vertical transistors 100 in the memory device 123 may be reversed relative to their positions in FIG. 9A, and the S/D contact 102 may be coupled between the channel 103 and the storage element 130. In some such embodiments, the S/D contact 102 of the vertical transistor 100 may itself provide the "top" electrode of the storage element 130, as suggested in FIG. 9B. In some such embodiments, the bit lines 145 may be provided by the conductive lines 114 of the conductive pathways 165 of the electronic devices 150 discussed herein, and the word lines 143 may be provided by the gate electrodes 106 of the electronic devices 150 discussed herein.

As noted above, any suitable techniques may be used to manufacture the vertical transistors 100 disclosed herein. FIG. 10 is a flow diagram of an illustrative method 1000 of manufacturing a vertical transistor, in accordance with various embodiments. Although the operations discussed below with reference to the method 1000 (and the other methods disclosed herein) are illustrated in a particular order and depicted once each, these operations may be repeated or performed in a different order (e.g., in parallel), as suitable. Additionally, various operations may be omitted, as suitable. Various operations of the method 1000 (and the other methods disclosed herein) may be illustrated with reference to one or more of the embodiments discussed above, but the method 1000 may be used to manufacture any suitable electronic device (including any suitable ones of the embodiments disclosed herein).

At 1002, a conductive material may be provided. For example, the material for the S/D contact 102 (e.g., as discussed above with reference to FIGS. 2B, 4C, and 6B) or the material for the conductive lines 114 (e.g., as discussed above with reference to FIG. 7) may be provided.

At 1004, a thin film semiconductor material may be provided on the conductive material. For example, the material for the channel(s) 103 (e.g., as discussed above with reference to FIGS. 2B, 4C, 6B, and 7) may be provided on the material for the S/D contact 102 (e.g., as discussed above with reference to FIGS. 2B, 4C, and 6B) or the material for the conductive lines 114 (e.g., as discussed above with reference to FIG. 7).

At 1006, the thin film semiconductor material may be patterned to form multiple pillars. For example, the material for the channel(s) 103 may be patterned to form multiple pillars 203 (e.g., as discussed above with reference to FIGS. 2D-2E, 4D-4E, and 6C-6E). In some embodiments, the conductive material (of 1002) and the thin film semiconductor material (of 1004) may be patterned simultaneously as part of the formation of multiple pillars (e.g., as discussed above with reference to FIGS. 6A-6H). For example, the thin film semiconductor material and the conductive material may be patterned to form multiple ridges, wherein a ridge has a pair of opposing faces provided by the thin film semiconductor material and the conductive material.

At 1008, a gate dielectric may be provided on side faces of the pillars. For example, the gate dielectric 108 may be provided on side faces of the channel(s) 103 (e.g., as discussed above with reference to FIGS. 2G-2H and 4F).

At 1010, a gate electrode may be provided in contact with the gate dielectric. For example, the gate electrode 106 may be provided in contact with the gate dielectric 108 (e.g., as discussed above with reference to FIGS. 2I-2K and 4F-4I).

FIG. 11 is a flow diagram of an illustrative method 1050 of operating a memory cell in an electronic device, in accordance with various embodiments. Although the operations discussed below with reference to the method 1050 (and the other methods disclosed herein) are illustrated in a particular order and depicted once each, these operations may be repeated or performed in a different order (e.g., in parallel), as suitable. Additionally, various operations may be omitted, as suitable. Various operations of the method 1050 (and the other methods disclosed herein) may be illustrated with reference to one or more of the embodiments discussed above, but the method 1050 may be used to operate any suitable electronic device (including any suitable ones of the embodiments disclosed herein).

At 1052, current through a storage element in an electronic device may be controlled by a transistor to set the storage element in a first memory state. The first memory state may be, for example, a low resistance state. The electronic device may include a semiconductor substrate and at least one metal interconnect layer between the semiconductor substrate and the transistor. In some embodiments, a bit line of the electronic device is in contact with the transistor, and a pair of opposing side faces of the bit line is aligned with a pair of opposing side faces of a channel of the transistor. For example, a memory cell 131 may include a storage element 130 and a vertical transistor 100 (e.g., as discussed above with reference to FIG. 9); the vertical transistor 100 may control current through the storage element 130 to set the memory stage (e.g., the resistance state) of the memory cell 131.

At 1054, current through the storage element may be controlled by the transistor to set the storage element in a second memory state different from the first memory state. The second memory state may be, for example, a high resistance state.

The vertical transistors 100, memory devices 123, or electronic devices 150 disclosed herein may be included in any suitable electronic device. FIGS. 12A-B are top views of a wafer 450 and dies 452 that may be formed from the wafer 450; the dies 452 may include any of the vertical transistors 100, memory devices 123, or electronic devices 150 disclosed herein. The wafer 450 may include semiconductor material and may include one or more dies 452 having integrated circuit elements (e.g., vertical transistors 100, memory devices 123, or electronic devices 150) formed on a surface of the wafer 450. Each of the dies 452 may be a repeating unit of a semiconductor product that includes any suitable device (e.g., the electronic device 150). After the fabrication of the semiconductor product is complete, the wafer 450 may undergo a singulation process in which each of the dies 452 is separated from one another to provide discrete "chips" of the semiconductor product. A die 452 may include one or more vertical transistors 100, memory devices 123, and electronic devices 150, and/or supporting circuitry to route electrical signals to the vertical transistors 100, memory devices 123, and electronic devices 150 (e.g., interconnects including conductive vias 112 and lines 114), as well as any other integrated circuit (IC) components. In some embodiments, the wafer 450 or the die 452 may include other memory devices, logic devices (e.g., AND, OR, NAND, or NOR gates), or any other suitable circuit element. Multiple ones of these devices may be combined on a single die 452. For example, a memory array formed by multiple memory devices (e.g., multiple memory cells 131) may be formed on a same die 452 as a processing device (e.g., the processing device 2002 of FIG. 14) or other logic that is configured to store information in the memory devices or execute instructions stored in the memory array.

Figure 13:
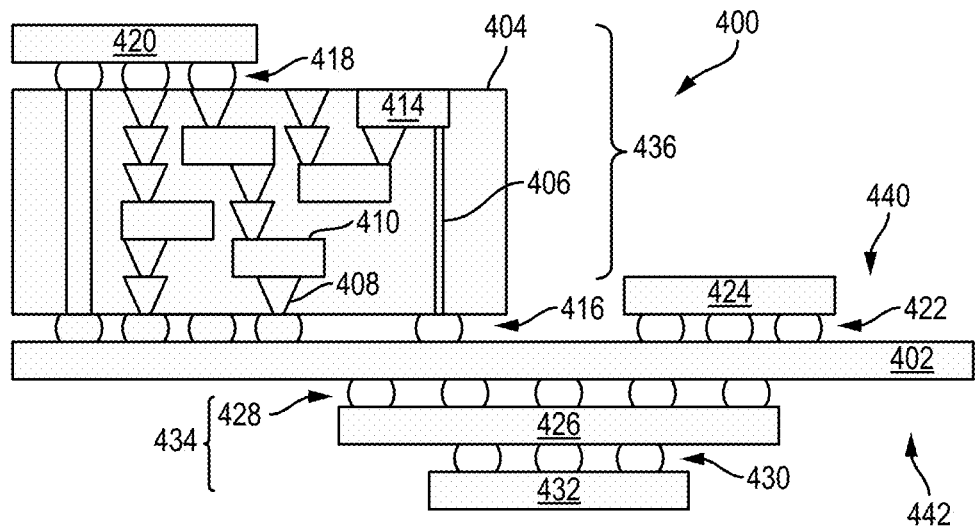
FIG. 13 is a cross-sectional side view of a device assembly that may include any of the vertical transistors disclosed herein.

FIG. 13 is a cross-sectional side view of a device assembly 400 that may include any of the vertical transistors 100, memory devices 123, or electronic devices 150 disclosed herein included in one or more packages. A "package" may refer to an electronic component that includes one or more integrated circuit (IC) devices that are structured for coupling to other components; for example, a package may include a die coupled to a package substrate that provides electrical routing and mechanical stability to the die. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 13 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls, male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. Although a single package 420 is shown in FIG. 13, multiple packages may be coupled to the interposer 404; indeed, additional interposers may be coupled to the interposer 404. The interposer 404 may provide an intervening substrate used to bridge the circuit board 402 and the package 420. The package 420 may include one or more vertical transistors 100, memory devices 123, or electronic devices 150, for example. Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 13, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices (e.g., the vertical transistors 100, memory devices 123, or electronic devices 150). More complex devices such as radio-frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may include one or more vertical transistors 100, memory devices 123, or electronic devices 150, for example.

The device assembly 400 illustrated in FIG. 13 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may include one or more vertical transistors 100, memory devices 123, or electronic devices 150, for example.

Figure 14:
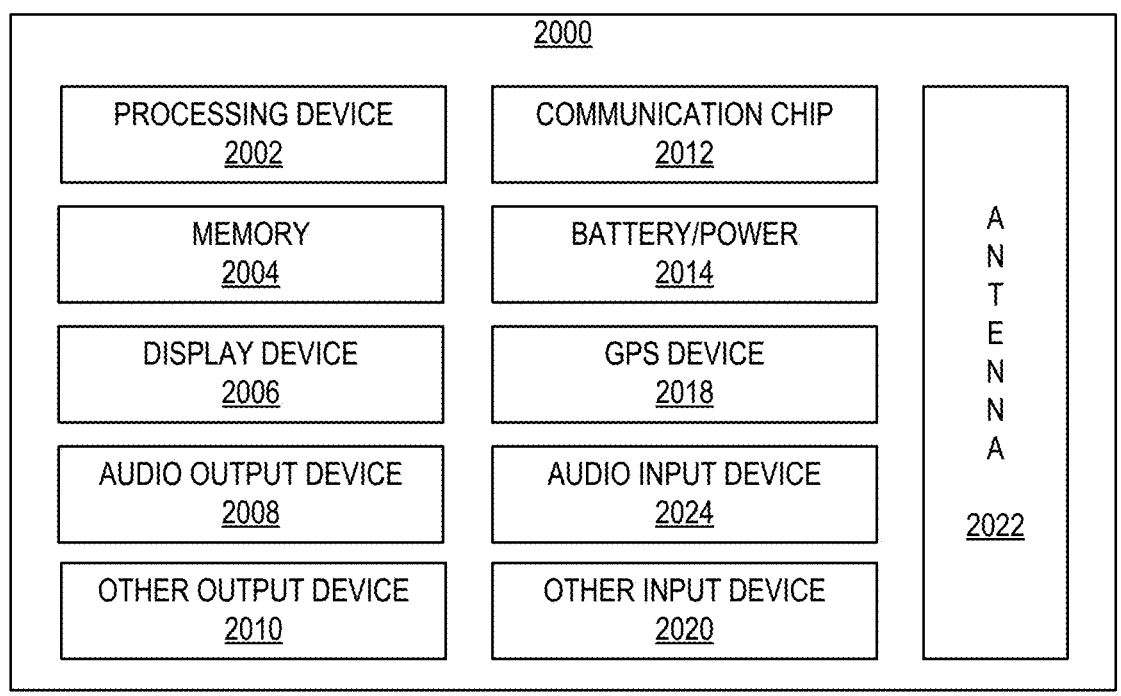
FIG. 14 is a block diagram of an example computing device that may include any of the vertical transistors disclosed herein, in accordance with various embodiments.

FIG. 14 is a block diagram of an example computing device 2000 that may include any of the vertical transistors 100, memory devices 123, or electronic devices 150 disclosed herein. A number of components are illustrated in FIG. 14 as included in the computing device 2000, but any one or more of these components may be omitted or duplicated, as suitable for the application. In some embodiments, some or all of the components included in the computing device 2000 may be attached to one or more printed circuit boards (e.g., a motherboard). In some embodiments, various ones of these components may be fabricated onto a single system-on-a-chip (SoC) die. Additionally, in various embodiments, the computing device 2000 may not include one or more of the components illustrated in FIG. 14, but the computing device 2000 may include interface circuitry for coupling to the one or more components. For example, the computing device 2000 may not include a display device 2006, but may include display device interface circuitry (e.g., a connector and driver circuitry) to which a display device 2006 may be coupled. In another set of examples, the computing device 2000 may not include an audio input device 2024 or an audio output device 2008, but may include audio input or output device interface circuitry (e.g., connectors and supporting circuitry) to which an audio input device 2024 or audio output device 2008 may be coupled.

The computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may interface with one or more of the other components of the computing device 2000 (e.g., the communication chip 2012 discussed below, the display device 2006 discussed below, etc.) in a conventional manner. The processing device 2002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. In some embodiments, the processing device 2002 may include one or more vertical transistors 100, memory devices 123, or electronic devices 150.

The computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. The memory 2004 may include one or more vertical transistors 100, memory devices 123, or electronic devices 150. In some embodiments, the memory 2004 may include memory that shares a die with the processing device 2002. This memory may be used as cache memory and may include embedded dynamic random access memory (eDRAM) or spin transfer torque magnetic random-access memory (STT-MRAM).

In some embodiments, the computing device 2000 may include a communication chip 2012 (e.g., one or more communication chips). For example, the communication chip 2012 may be configured for managing wireless communications for the transfer of data to and from the computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not. The communication chip 2012 may include one or more vertical transistors 100, memory devices 123, or electronic devices 150.

The communication chip 2012 may implement any of a number of wireless standards or protocols, including but not limited to Institute for Electrical and Electronic Engineers (IEEE) standards including Wi-Fi (IEEE 1402.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The computing device 2000 may include battery/power circuitry 2014. The battery/power circuitry 2014 may include one or more energy storage devices (e.g., batteries or capacitors) and/or circuitry for coupling components of the computing device 2000 to an energy source separate from the computing device 2000 (e.g., AC line power).

The computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The computing device 2000 may include an audio output device 2008 (or corresponding interface circuitry, as discussed above). The audio output device 2008 may include any device that generates an audible indicator, such as speakers, headsets, or earbuds, for example.

The computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The computing device 2000 may include a global positioning system (GPS) device 2018 (or corresponding interface circuitry, as discussed above). The GPS device 2018 may be in communication with a satellite-based system and may receive a location of the computing device 2000, as known in the art.

The computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide various examples of the embodiments disclosed herein.

Example 1 is a device, including: a semiconductor substrate; a first transistor in a first layer on the semiconductor substrate; and a second transistor in a second layer, wherein the second transistor includes a first source/drain (S/D) contact, a second S/D contact, a channel, a gate electrode, and a gate dielectric between the gate electrode and the channel; wherein the first layer is between the second layer and the semiconductor substrate, and the first S/D contact is between the second S/D contact and the first layer.

Example 2 may include the subject matter of Example 1, and may further specify that the channel includes a thin film material.

Example 3 may include the subject matter of any of Examples 1-2, and may further specify that the channel includes amorphous silicon or polysilicon.

Example 4 may include the subject matter of any of Examples 1-3, and may further specify that the channel includes germanium, silicon germanium, gallium arsenide, indium antimonide, indium gallium arsenide, gallium antimonide, indium gallium oxide, indium gallium zinc oxide, or tin oxide.

Example 5 may include the subject matter of any of Examples 1-4, and may further specify that the gate dielectric wraps around the channel, and the gate electrode wraps around the gate dielectric.

Example 6 may include the subject matter of any of Examples 1-5, and may further specify that the first S/D contact includes a semiconductor and an n-type dopant.

Example 7 may include the subject matter of any of Examples 1-6, and may further specify that the first S/D contact includes a metal.

Example 8 may include the subject matter of any of Examples 1-7, and may further specify that the device further includes a third transistor in the second layer, wherein the third transistor includes a first S/D contact, a second S/D contact, a channel, a gate electrode, and a gate dielectric between the gate electrode and the channel, and wherein the gate electrode of the third transistor is materially continuous with the gate electrode of the second transistor.

Example 9 may include the subject matter of Example 8, and may further specify that the device further includes a fourth transistor in the second layer, wherein the fourth transistor includes a first S/D contact, a second S/D contact, a channel, a gate electrode, and a gate dielectric between the gate electrode and the channel, and wherein the gate electrode of the fourth transistor is not materially continuous with the gate electrode of the second transistor and the third transistor.

Example 10 may include the subject matter of Example 9, and may further specify that the first S/D contact of the second transistor is electrically continuous with the first S/D contact of the fourth transistor.

Example 11 may include the subject matter of Example 10, and may further include a storage element coupled to the first S/D contact or the second S/D contact of the first transistor.

Example 12 may include the subject matter of any of Examples 1-12, and may further include a storage element coupled to the first S/D contact or the second S/D contact.

Example 13 may include the subject matter of Example 12, and may further specify that the storage element includes a resistive random access memory (RRAM) element, a dynamic random access memory (DRAM) element, or a magnetic random access memory (MRAM) element.

Example 14 may include the subject matter of Example 12, and may further specify that a bit line is coupled to the first S/D contact or the second S/D contact, and a word line is coupled to the gate electrode.

Example 15 is a method of manufacturing a vertical transistor, including: providing a conductive material; providing a thin film semiconductor material on the conductive material; patterning the thin film semiconductor material to form a plurality of pillars; providing a gate dielectric on side faces of the pillars; and providing a gate electrode in contact with the gate dielectric.

Example 16 may include the subject matter of Example 15, and may further specify that the thin film semiconductor material includes an amorphous semiconductor, a polycrystalline semiconductor, a crystalline semiconductor, an amorphous semiconductor oxide, a polycrystalline semiconductor oxide, or a crystalline semiconductor oxide.

Example 17 may include the subject matter of any of Examples 15-16, and may further include patterning the conductive material with an etch process subsequent to patterning the thin film semiconductor material.

Example 18 may include the subject matter of Example 17, and may further include providing an insulating material around the patterned conductive material, wherein the gate electrode is provided on the insulating material.

Example 19 may include the subject matter of any of Examples 15-18, and may further specify that the thin film semiconductor material has a thickness between 10 nanometers and 100 nanometers.

Example 20 may include the subject matter of any of Examples 15-19, and may further specify that providing the gate dielectric includes conformal deposition and directional etching of the gate dielectric.

Example 21 may include the subject matter of any of Examples 15-20, and may further include patterning the gate electrode such that a portion of the gate electrode is materially continuous around multiple ones of the pillars, but is not materially continuous around all of the pillars.

Example 22 is a method of operating a memory cell in an electronic device, including: controlling current to a storage element, through a transistor, to set the storage element in a low resistance state; and controlling current to the storage element, through the transistor, to reset the storage element to a high resistance state; wherein the electronic device includes a semiconductor substrate and at least one metal interconnect layer between the semiconductor substrate and the transistor.

Example 23 may include the subject matter of Example 22, and may further specify that the memory cell is one of a plurality of memory cells in the electronic device, and gates of multiple ones of the memory cells are electrically continuous.

Example 24 may include the subject matter of Example 23, and may further specify that bit lines associated with different ones of the multiple memory cells are not electrically continuous.

Example 25 is a computing device, including: a circuit board; a processing device coupled to the circuit board; and a memory device coupled to the processing device, wherein the memory device includes an array of storage elements and an associated array of transistors, and the array of storage elements and the array of transistors are each arranged in a grid having a same pitch.

Example 26 may include the subject matter of Example 25, and may further specify that the pitch is between 25 and 100 nanometers.

Example 27 may include the subject matter of any of Examples 25-26, and may further specify that the array of storage elements is above the array of transistors, or the array of transistors is above the array of storage elements.

Example 28 may include the subject matter of any of Examples 25-27, and may further specify that the memory device includes a plurality of word lines, and different individual word lines strap together gates in different individual rows of transistors in the array of transistors.

Example 29 may include the subject matter of Example 28, and may further specify that the memory device includes a plurality of bit lines, and different individual bit lines strap together source/drain contacts in different individual columns of transistors in the array of transistors.

The invention claimed is:

1. A device, comprising:
   a semiconductor substrate;
   a first transistor in a first layer on the semiconductor substrate; and
   a second transistor in a second layer, wherein the second transistor includes a first source/drain (S/D) contact, a second S/D contact, a channel, a gate electrode, and a gate dielectric between the gate electrode and the channel;
   wherein:
   the first layer is between the second layer and the semiconductor substrate, and
   the first S/D contact is between the second S/D contact and the first layer.

2. The device of claim 1, wherein the channel includes a thin film material.

3. The device of claim 1, wherein the gate dielectric wraps around the channel, and the gate electrode wraps around the gate dielectric.

4. The device of claim 1, wherein the first S/D contact includes a semiconductor and an n-type dopant.

5. The device of claim 1, wherein the first S/D contact includes a metal.

6. The device of claim 1, wherein the device further includes:
   a third transistor in the second layer, wherein the third transistor includes a first S/D contact, a second S/D contact, a channel, a gate electrode, and a gate dielectric between the gate electrode and the channel, and wherein the gate electrode of the third transistor is materially continuous with the gate electrode of the second transistor.

7. The device of claim 6, wherein the device further includes:
   a fourth transistor in the second layer, wherein the fourth transistor includes a first S/D contact, a second S/D contact, a channel, a gate electrode, and a gate dielectric between the gate electrode and the channel, and wherein the gate electrode of the fourth transistor is not materially continuous with the gate electrode of the second transistor and the third transistor.

8. The device of claim 7, wherein the first S/D contact of the second transistor is electrically continuous with the first S/D contact of the fourth transistor.

9. The device of claim 8, further comprising:
   a storage element coupled to the first S/D contact or the second S/D contact of the first transistor.

10. The device of claim 1, further comprising:
    a storage element coupled to the first S/D contact or the second S/D contact.

11. The device of claim 10, wherein the storage element includes a resistive random access memory (RRAM) element, a dynamic random access memory (DRAM) element, or a magnetic random access memory (MRAM) element.

12. The device of claim 10, wherein a bit line is coupled to the first S/D contact or the second S/D contact, and a word line is coupled to the gate electrode.

13. The device of claim 1, wherein the channel includes amorphous silicon or polysilicon.

14. The device of claim 1, wherein the channel includes germanium, silicon germanium, gallium arsenide, indium antimonide, indium gallium arsenide, gallium antimonide, indium gallium oxide, indium gallium zinc oxide, or tin oxide.

* * * * *